(12) United States Patent
Hudson et al.

(10) Patent No.: US 11,111,597 B2
(45) Date of Patent: Sep. 7, 2021

(54) METHODS FOR GROWING A NITROGEN DOPED SINGLE CRYSTAL SILICON INGOT USING CONTINUOUS CZOCHRALSKI METHOD

(71) Applicant: GlobalWafers Co., Ltd., Hsinchu (TW)

(72) Inventors: Carissima Marie Hudson, St. Charles, MO (US); Jae-Woo Ryu, Chesterfield, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 81 days.

(21) Appl. No.: 16/569,949

(22) Filed: Sep. 13, 2019

(65) Prior Publication Data

US 2021/0079554 A1  Mar. 18, 2021

(51) Int. Cl.
| | | |
|---|---|---|
| *C30B 15/04* | (2006.01) | |
| *C30B 15/14* | (2006.01) | |
| *H01L 21/322* | (2006.01) | |
| *C30B 15/00* | (2006.01) | |
| *C30B 29/06* | (2006.01) | |
| *C30B 15/20* | (2006.01) | |

(52) U.S. Cl.
CPC ............ *C30B 15/04* (2013.01); *C30B 15/002* (2013.01); *C30B 15/14* (2013.01); *C30B 15/203* (2013.01); *C30B 29/06* (2013.01); *H01L 21/3225* (2013.01)

(58) Field of Classification Search
CPC ....... C30B 15/04; C30B 15/002; C30B 15/02; C30B 15/20; C30B 29/06
See application file for complete search history.

(56) References Cited

U.S. PATENT DOCUMENTS

| | | |
|---|---|---|
| 5,069,741 A | 12/1991 | Kida et al. |
| 5,126,114 A | 6/1992 | Kamio et al. |
| 5,139,750 A | 8/1992 | Shima et al. |
| 5,270,020 A | 12/1993 | Suzuki et al. |
| 5,871,581 A | 2/1999 | Atami et al. |

(Continued)

FOREIGN PATENT DOCUMENTS

| | | |
|---|---|---|
| CN | 102260900 B | 11/2013 |
| CN | 105887194 A | 8/2016 |

(Continued)

OTHER PUBLICATIONS

Voronkov, Vladimir et al., Void Properties in Silicon Heavily Doped with Arsenic and Phosphorus, Physica Status Solidi A, vol. 209, No. 10, 2012, pp. 1898-1901.

(Continued)

*Primary Examiner* — Robert M Kunemund
(74) *Attorney, Agent, or Firm* — Armstrong Teasdale LLP

(57) ABSTRACT

A method for growing a single crystal silicon ingot by the continuous Czochralski method is disclosed. The melt depth and thermal conditions are constant during growth because the silicon melt is continuously replenished as it is consumed, and the crucible location is fixed. The critical v/G is determined by the hot zone configuration, and the continuous replenishment of silicon to the melt during growth enables growth of the ingot at a constant pull rate consistent with the critical v/G during growth of a substantial portion of the main body of the ingot. The continuous replenishment of silicon is accompanied by periodic or continuous nitrogen addition to the melt to result in a nitrogen doped ingot.

36 Claims, 11 Drawing Sheets

(56) References Cited

U.S. PATENT DOCUMENTS

| | | | |
|---|---|---|---|
| 5,891,245 | A | 4/1999 | Atami et al. |
| 5,935,320 | A | 8/1999 | Graef et al. |
| 6,261,361 | B1 | 7/2001 | Lida et al. |
| 6,334,896 | B1 | 1/2002 | Lida et al. |
| 6,569,237 | B2 | 5/2003 | Tanaka et al. |
| 6,843,847 | B1 | 1/2005 | Lida et al. |
| 7,320,731 | B2 | 1/2008 | Ono et al. |
| 8,317,919 | B2 | 11/2012 | Bender |
| 9,051,659 | B2 | 6/2015 | Deluca et al. |
| 9,458,554 | B2 | 10/2016 | Mueller et al. |
| 2003/0157814 | A1* | 8/2003 | Iida ............ H01L 21/3225 438/795 |
| 2009/0081856 | A1* | 3/2009 | Umeno ............ C30B 15/04 438/501 |
| 2011/0030793 | A1 | 2/2011 | Kraiem et al. |
| 2012/0056135 | A1 | 3/2012 | Deluca et al. |
| 2012/0301386 | A1 | 11/2012 | Johnson et al. |
| 2013/0093058 | A1 | 4/2013 | Nakai |
| 2015/0333193 | A1 | 11/2015 | Appel et al. |
| 2018/0266015 | A1* | 9/2018 | Lu ............ C30B 29/06 |

FOREIGN PATENT DOCUMENTS

| | | |
|---|---|---|
| EP | 1887110 A1 | 2/2008 |
| JP | S57118089 A | 7/1982 |
| JP | S5310495 A | 11/1993 |
| JP | 2001089294 A | 4/2011 |
| WO | 2009025336 A1 | 2/2009 |
| WO | 2016031164 A1 | 3/2016 |

OTHER PUBLICATIONS

Dash, William C., Growth of Silicon Crystals Free from Dislocations, Journal of Applied Physics, vol. 30, No. 4, 2959, pp. 459-474 (abstract only).

Wang, J. H., "Resistivity distribution in bulk growth of silicon single crystals," Journal of Crystal Growth 275 (2005), pp. e73-e78.

Wang, J. H., "Resistivity distribution of silicon single crystals using codoping," Journal of Crystal Growth 280 (2005), pp. 408-412.

Wang, J. H., et al., "Control of Axial Resistivity Distribution in Bridgman Silicon Growth," Japanese Journal of Applied Physics, vol. 43, No. 7A (2004), pp. 4079-4081.

Forster, M., et al., "Boron-oxygen defect in Czochralski-silicon co-doped with gallium and boron," Appl. Phys. Lett. 100, 042110 (2012), 8 pgs.

Glunz, S. W., et al., "Comparison of Boron- and Gallium-doped p-Type Czochralski Silicon for Photovoltaic Application," Prog. Photovolt. Res. Appl. 7 (1999), pp. 463-469.

Fourmond, E., et al., "Electrical properties of boron, phosphorus and gallium co-doped silicon," SiliconPV 17-20 (Apr. 2011), 5 pgs.

Chen, P., et al., "Gallium doped Czochralski silicon with phosphorus compensation for photovoltaic application," State Key Lab of Silicon Materials, Zhejiang University, available before Dec. 28, 2016, 9 pgs.

Cuevas, A., et al., "Compensation Engineering for Silicon Solar Cells," Energy Procedia 15 (2012), pp. 67-77.

International Search Report and Written Opinion issued in connection with PCT/US2020/044844 dated Nov. 27, 2020; pp. 1-25.

* cited by examiner

METHODS FOR GROWING A NITROGEN DOPED SINGLE CRYSTAL SILICON INGOT USING CONTINUOUS CZOCHRALSKI METHOD

FIELD OF THE DISCLOSURE

The field of the disclosure relates to a method to grow a single crystal silicon ingot using the continuous Czochralski method and to a single crystal silicon ingot grown by this method.

BACKGROUND

Single crystal silicon, which is the starting material for most processes for the fabrication of semiconductor electronic components, is commonly prepared by the Czochralski ("Cz") method. In this method, polycrystalline silicon ("polysilicon") is charged to a crucible and melted, a seed crystal is brought into contact with the molten silicon, and a single crystal is grown by slow extraction. After formation of a neck is complete, the diameter of the crystal is enlarged by, for example, decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter is typically reduced gradually to form a tail end in the form of an end-cone. The end-cone usually is formed by increasing the crystal pull rate and heat supplied to the crucible. When the diameter becomes small enough, the crystal is then separated from the melt.

Czochralski growing techniques include the batch Czochralski method and the continuous Czochralski method. In batch CZ, a single polycrystalline charge is loaded into the crucible, the single charge being sufficient to grow a single crystal silicon ingot, after which the crucible is essentially depleted of silicon melt. In continuous Czochralski (CCZ) growth, polycrystalline silicon may be continually or periodically added to the molten silicon to replenish the melt during the growth process and, as a result, multiple ingots can be pulled from a single crucible during a growth process.

To carry out the CCZ process, the traditional batch Czochralski growth chamber and apparatus are modified to include a means for feeding additional polycrystalline silicon to the melt in a continuous or semi-continuous fashion without adversely affecting the properties of the growing ingot. As the seed crystal is continuously grown from the melt, solid polycrystalline silicon such as granular polycrystalline silicon is added to the melt to replenish the melt. The feed rate of the additional solid polycrystalline silicon added to the melt is typically controlled to maintain process parameters. In order to reduce the adverse effects of this replenishing activity on simultaneous crystal growth, the traditional quartz crucible is often modified to provide an outer or annular melt zone into which the added material is delivered along with an inner growth zone from which the silicon ingot is pulled. These zones are in fluid flow communication with one another.

The continuously shrinking size of the modern microelectronic device imposes challenging restrictions on the quality of the silicon substrate, which is essentially determined by the size and the distribution of the grown-in microdefects. Most of the microdefects formed in silicon crystals grown by the Czochralski (CZ) process and the Float Zone (FZ) process are the agglomerates of intrinsic point defects of silicon—vacancies and self-interstitials (or, simply, interstitials).

A series of studies have established that the interstitial agglomerates exist in two forms—globular interstitial clusters, termed B swirl defect (or B-defects), and the dislocation loops, termed A swirl defect (or A-defects). Later discovered vacancy agglomerates, known as D-defects, have been identified as octahedral voids. Voronkov provided the well-accepted explanation for the microdefect distributions observed in silicon crystals on the basis of the crystal growth conditions. According to Voronkov's model, or theory, the temperature field in the vicinity of the melt/crystal interface drives the recombination of the point defects providing driving forces for their diffusion from the melt/crystal interface—where they exist at their respective equilibrium concentrations—into the crystal bulk. The interplay between the transport of the point defects, both by the diffusion and the convection, and their recombination establishes the point defect concentration beyond a short distance away from the interface, termed the recombination length. Typically, the difference between the vacancy concentration and the interstitial concentration beyond the recombination length, termed the excess point defect concentration, remains essentially fixed away from the lateral surface of the crystal. In a rapidly pulled crystal, the spatial redistribution of the point defects by their diffusion beyond the recombination length is generally not important—with the exception of a region close to the lateral surface of the crystal that acts as a sink or a source of the point defects. Therefore, if the excess point defect concentration beyond the recombination length is positive, vacancies remain in excess, and agglomerate to form D-defects at lower temperatures. If the excess point defect concentration is negative, interstitials remain the dominant point defects, and agglomerate to form A-defects and B-defects. If the excess point defect concentration is below some detection threshold, no detectable microdefects are formed. Thus, typically, the type of grown-in microdefects is determined simply by the excess point defect concentration established beyond the recombination length. The process of establishing the excess point defect concentration is termed the initial incorporation and the dominant point defect species is termed the incorporated dominant point defect. The type of the incorporated point defects is determined by the ratio of the crystal pull-rate (v) to the magnitude of the axial temperature gradient in the vicinity of the interface (G). At a higher v/G, the convection of the point defects dominates their diffusion, and vacancies remain the incorporated dominant point defects, as the vacancy concentration at the interface is higher than the interstitial concentration. At a lower v/G, the diffusion dominates the convection, allowing the incorporation of the fast diffusing interstitials as the dominant point points. At a v/G close to its critical value, both the point defects are incorporated in very low and comparable concentrations, mutually annihilating each other and thus suppressing the potential formation of any microdefects at lower temperatures. The observed spatial microdefect distribution can be typically explained by the variation of v/G, caused by a radial non-uniformity of G and by an axial variation of v. A striking feature of the radial microdefect distribution is the oxide particles formed through the interaction of oxygen with vacancies in the regions of relatively lower incorporated vacancy concentration—at a small range of v/G marginally above the critical v/G. These particles form a narrow spatial band that can be revealed by thermal oxidation as the OSF (oxidation-induced stacking faults) ring. Quite often, the OSF ring marks the boundary between adjacent crystal regions that are vacancy-dominated and interstitial-dominated, known as the V/I boundary.

The microdefect distributions in CZ crystals grown at lower rates in many modern processes, however, are influenced by the diffusion of the point defects in the crystal bulk, including the diffusion induced by the lateral surfaces of the crystals. Therefore, an accurate quantification of the microdefect distributions in CZ crystals preferably incorporates the 2-dimensional point defect diffusion, both axially and radially. Quantifying only the point defect concentration field can qualitatively capture the microdefect distribution in a CZ crystal, as the type of the microdefects formed is directly determined by it. For a more accurate quantification of the microdefect distribution, however, capturing the agglomeration of the point defects is necessary. Traditionally, the microdefect distribution is quantified by decoupling the initial incorporation of the point defects and the subsequent formation of the microdefects. This approach ignores the diffusion of the dominant point defects in the vicinity of the nucleation region, from the regions at higher temperatures (where the microdefect density is negligible) to the regions at lower temperatures (where the microdefects exist in higher densities and consume the point defects). Alternatively, a rigorous numerical simulation based on predicting the size distributions of the microdefect populations at every location in the crystal is numerically expensive.

The transition between vacancy and interstitial dominated material occurs at a critical value of v/G, which currently appears to be about $2.5 \times 10^{-5}$ cm$^2$/sK. If the value of v/G exceeds the critical value, vacancies are the predominant intrinsic point defect, with their concentration increasing with increasing v/G. If the value of v/G is less than the critical value, silicon self-interstitials are the predominant intrinsic point defect, with their concentration increasing with decreasing v/G. Accordingly, process conditions, such as growth rate (which affect v), as well as hot zone configurations (which affect G), can be controlled to determine whether the intrinsic point defects within the single crystal silicon will be predominantly vacancies (where v/G is generally greater than the critical value) or self-interstitials (where v/G is generally less than the critical value).

Agglomerated defect formation generally occurs in two steps. First, defect "nucleation" occurs, which is the result of the intrinsic point defects being supersaturated at a given temperature; above this "nucleation threshold" temperature, intrinsic point defects remain soluble in the silicon lattice. The nucleation temperature for agglomerated intrinsic point defects is greater than about 1000° C.

Once this "nucleation threshold" temperature is reached, intrinsic point defects agglomerate; that is, precipitation of these point defects out of the "solid solution" of the silicon lattice occurs. The intrinsic point defects will continue to diffuse through the silicon lattice as long as the temperature of the portion of the ingot in which they are present remains above a second threshold temperature (i.e., a "diffusivity threshold"). Below this "diffusivity threshold" temperature, intrinsic point defects are no longer mobile within commercially practical periods of time.

While the ingot remains above the "diffusivity threshold" temperature, vacancy or interstitial intrinsic point defects diffuse through the silicon lattice to sites where agglomerated vacancy defects or interstitial defects, respectively, are already present, causing a given agglomerated defect to grow in size. Growth occurs because these agglomerated defect sites essentially act as "sinks," attracting and collecting intrinsic point defects because of the more favorable energy state of the agglomeration.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Also present in regions of excess vacancies are clusters of oxygen or silicon dioxide. Some of these clusters remain small and relatively strain-free, causing essentially no harm to a majority of devices prepared from such silicon. Some of these clusters are large enough to act as the nuclei for ring oxidation induced stacking faults (OISF). It is speculated that this particular defect is facilitated by previously nucleated oxygen agglomerates catalyzed by the presence of excess vacancies. The oxide clusters are primarily formed in CZ growth below 1000° C. in the presence of moderate vacancy concentration.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

In this regard it is to be noted that, generally speaking, oxygen in interstitial form in the silicon lattice is typically considered to be a point defect of silicon, but not an intrinsic point defect, whereas silicon lattice vacancies and silicon self-interstitials (or, simply, interstitials) are typically considered to be intrinsic point defects. Accordingly, essentially all microdefects may be generally described as agglomerated point defects, while D-defects (or voids), as well as A-defects and B-defects (i.e., interstitial defects) may be more specifically described as agglomerated intrinsic point defects. Oxygen clusters are formed by absorbing vacancies; hence, oxygen clusters can be regarded as agglomerates of both vacancies and oxygen.

It is to be further noted that the density of such vacancy and self-interstitial agglomerated point defects in Czochralski silicon historically has been within the range of about $1 \times 10^3$/cm$^3$ to about $1 \times 10^7$/cm$^3$, whereas the density of oxygen clusters varies between around $1 \times 10^8$/cm$^3$ to $1 \times 10^{10}$/cm$^3$. Agglomerated intrinsic point defects are therefore of rapidly increasing importance to device manufacturers, because such defects can severely impact the yield potential of the single crystal silicon material in the production of complex and highly integrated circuits.

In view of the foregoing, in many applications it is preferred that a portion or all of the silicon crystal, which is subsequently sliced into silicon wafers, be substantially free of these agglomerated intrinsic point defects. To-date, several approaches for growing substantially defect-free silicon crystals have been reported. Generally speaking, all these approaches involve controlling the ratio v/G, in order to determine the initial type and concentration of intrinsic point defects present in the growing CZ single crystal silicon crystal. Additionally, however, such approaches may involve controlling the subsequent thermal history of the crystal to allow for prolonged diffusion time to suppress the concentration of intrinsic point defects therein, and thus substantially limit or avoid the formation of agglomerated intrinsic point defects in a portion or all of the crystal. (See, for example, U.S. Pat. Nos. 6,287,380; 6,254,672; 5,919,302; 6,312,516 and 6,328,795; the entire contents of which are hereby incorporated herein by reference.) Alternatively, however, such approaches may involve a rapidly cooled silicon (RCS) growth process, wherein the subsequent thermal history of the crystal is then controlled to rapidly cool at least a portion of the crystal through a target nucleation temperature, in order to control the formation of agglomerated intrinsic point defects in that portion. One or both of these approaches may also include allowing at least a portion of the grown crystal to remain above the nucleation temperature for a prolonged period of time, to reduce the concentration of intrinsic point defects prior to rapidly cooling this portion of the crystal through the target nucleation temperature, thus substantially limiting or avoiding the formation of agglomerated intrinsic point defects therein. (See, e.g., U.S. Patent Application Publication No. 2003/0196587, the entire disclosure of which is incorporated herein by reference.) Still further, methods have been developed to reduce or eliminate agglomerated point defects from the center of the ingot to the edge by the simultaneous control of the cooling rate of the solidified ingot and the radial variation of the axial temperature gradient in the vicinity of the interface (G). (See, e.g., U.S. Pat. No. 8,673,248, the entire disclosure of which is incorporated herein by reference.)

Polished silicon wafers that meet manufacturer requirements for lack of agglomerated point defects, e.g., crystal originated pits (COP), may be referred to as Neutral Silicon or Perfect Silicon. Perfect Silicon wafers are preferred for many semiconductor applications as a lower cost polished wafer alternative to, for example, higher epitaxially deposited wafers. In the course of the last 20 years, many silicon wafer suppliers have developed Defect Free and COP Free wafer products in both 200 mm and 300 mm diameter for sale mostly to the Memory (DRAM/NAND/FLASH) market which traditionally has been more sensitive to cost pressures within the market. The industrial standard for acceptable defectivity has evolved over this time frame in terms of acceptable level of light point scatterings (LLS) and Gate Oxide Intensity (GOI) as customer applications device nodes have shrunk. For example, an industrial COP free specification may have been, at one time, less than a few hundred at no more than 0.12 um size. More current standards demand less than 20 COPs at no more than 0.026 um size to qualify as perfect silicon. As another example, the past standard for GOI in a MOS transistor was 95% at ≤8 MV (B-mode). Currently, specifications are moving to 99% at 10~12 MV (D-mode). On top of this requirement, the need for improved radial oxygen precipitation across the wafer as measured traditionally by BMD density (bulk micro defects) and BMD size distribution are required as device nodes shrink in order to avoid substrate slip during processing or warp that may impact patterned overlay during device lithography. As these specifications have tightened (LLS, GOI, BMD uniformity, etc.), the control window for defect and COP free silicon growth has shrunk considerably, reducing crystal throughput of the process considerably. This is because the window of acceptable band structure (which can be directly translated to process window of operation) has shifted over time with the specifications.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method of preparing a single crystal silicon ingot by the Continuous Czochralski method, the method comprising: adding an initial charge of polycrystalline silicon to a crucible, the initial charge further comprising a source of nitrogen; heating the crucible comprising the initial charge of polycrystalline silicon and the source of nitrogen to cause a silicon melt to form in the crucible, the silicon melt comprising an initial volume of molten silicon and having an initial melt elevation level; contacting a silicon seed crystal with a silicon melt; withdrawing the silicon seed crystal to grow a neck portion, wherein the silicon seed crystal is withdrawn at a neck portion pull rate during growth of the neck portion, and further wherein the neck portion has a neck portion nitrogen concentration of at least about $1\times10^{13}$ atoms/cm$^3$; withdrawing the silicon seed crystal to grow an outwardly flaring seed-cone adjacent the neck portion, wherein the silicon seed crystal is withdrawn at a seed-cone pull rate during growth of the outwardly flaring seed-cone, and further wherein the outwardly flaring seed-cone has an outwardly flaring seed-cone nitrogen concentration of at least about $1\times10^{13}$ atoms/cm$^3$; and withdrawing the silicon seed crystal to grow a main body of the single crystal silicon ingot adjacent the outwardly flaring seed-cone, wherein the silicon melt comprises a volume of molten silicon and a melt elevation level during growth of the main body of the single crystal silicon ingot, and further wherein the main body of the single crystal silicon has a main body nitrogen concentration of at least about $1\times10^{13}$ atoms/cm$^3$; wherein the main body of the single crystal silicon ingot is grown at an initial variable main body pull rate and a constant main body pull rate, wherein the main body of the single crystal silicon ingot is grown at the initial variable main body pull rate for less than about 20% of a length of the main body of the single crystal silicon ingot and grown at the constant main body pull rate during growth for at least about 30% of the length of the main body of the single crystal silicon ingot; and further wherein polycrystalline is continuously fed or periodically feed to the crucible to thereby replenish a volume of molten silicon and to thereby maintain a melt elevation level in the crucible during growth of the main body of the single crystal silicon ingot and the source of nitrogen is continuously fed or periodically fed to the crucible to thereby replenish an amount of nitrogen.

In another aspect, the present disclosure is directed to a single crystal silicon ingot having a main body portion, wherein the main body portion has a circumferential edge, a central axis having an axial length that is parallel to the circumferential edge, and a radius that extends from the central axis to the circumferential edge, wherein a wafer sliced from any portion of the main body over at least 60% of axial length of the main body of the single crystal silicon ingot, at least 70% of axial length of the main body of the single crystal silicon ingot, or at least 80% of axial length of the main body of the single crystal silicon ingot is characterized by non-detectable FPDs (Flow Pattern Defect by Secco etching technique) and DSODs (Direct Surface Oxide Defect particle count after electric breakdown) and zero I-defects (A-defect) by Secco-etching technique.

In another aspect, the present disclosure is directed to a single crystal silicon ingot having a main body portion, wherein the main body portion has a circumferential edge, a central axis having an axial length that is parallel to the circumferential edge, and a radius that extends from the central axis to the circumferential edge, wherein the main body portion comprises: interstitial oxygen at a main body oxygen concentration that varies by no more than 20% above and no less than 20% below an average main body oxygen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot.

In another aspect, the present disclosure is directed to a single crystal silicon ingot having a main body portion, wherein the main body portion has a circumferential edge, a central axis having an axial length that is parallel to the circumferential edge, and a radius that extends from the central axis to the circumferential edge, wherein the main body portion comprises: nitrogen at a main body nitrogen concentration that varies by no more than 20% above and no less than 20% below an average main body nitrogen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot.

In another aspect, the present disclosure is directed to a single crystal silicon ingot having a main body portion, wherein the main body portion has a circumferential edge, a central axis having an axial length that is parallel to the circumferential edge, and a radius that extends from the central axis to the circumferential edge, wherein the main body portion comprises: further wherein the main body portion has a resistivity that varies by no more than 20% above and no less than 20% below an average main body resistivity over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1A:
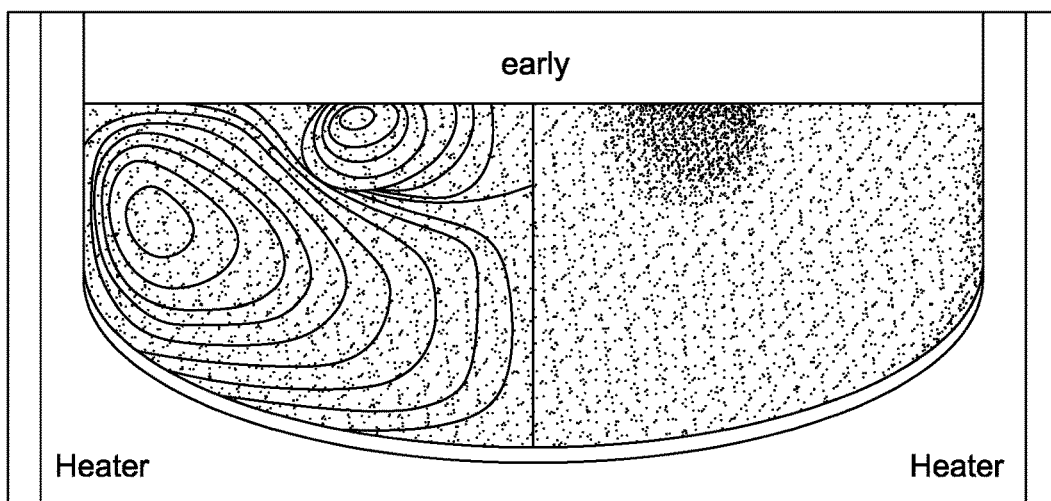
FIGS. 1A (early body growth), 1B (middle body growth), and 1C (late body growth) illustrate the melt volume or depth and crucible position as a function of crystal length during an exemplary batch Czochralski process.

In the context of the present disclosure, "perfect silicon" refers to Czochralski grown single crystal silicon ingots or single crystal silicon wafers sliced from Czochralski grown single crystal silicon ingots grown under conditions to meet or exceed the standards of Perfect Silicon™ (SunEdison Semiconductor, Ltd.). These standards include an ingot or wafer sliced therefrom that meets or exceeds industry specifications for agglomerated defects, DSOD (direct surface oxide defects), COP (crystal originated pits or particles), D-Defects, and I-defects, etc. For example, "perfect silicon" wafers may be characterized by non-detectable FPD (Flow Pattern Defect by Secco etching technique) and DSOD (Direct Surface Oxide Defect particle count after electric breakdown) and zero I-defect (A-defect) by Secco-etching technique. The Secco etch comprises applying a dilute aqueous solution of an alkali dichromate and hydrofluoric acid, for suitably revealing dislocations and other lattice defects in the various crystallographic (100), (111), and (110) planes of silicon. The etch brings out both lineage (low angle grain boundaries) and slip lines. The method of the present disclosure enables the growth of a single crystal silicon ingot comprising perfect silicon, e.g., wafers sliced from such an ingot, over at least about 70% of the length of the main body of the single crystal silicon ingot, such as over at least about 80% of the length of the main body of the single crystal silicon ingot, or even over at least about 90% of the length of the main body of the single crystal silicon ingot. In some embodiments, wafers sliced from ingots grown over at least about 60% of the length of the main body of the single crystal silicon ingot, over at least about 70% of the length of the main body of the single crystal silicon ingot, such as over at least about 80% of the length of the main body of the single crystal silicon ingot, or even over at least about 90% of the length of the main body of the single crystal silicon ingot are characterized by non-detectable FPD (Flow Pattern Defect by Secco etching technique) and DSOD (Direct Surface Oxide Defect particle count after electric breakdown) and zero I-defect (A-defect) by Secco-etching technique. In some embodiments, wafers sliced from ingots grown over at least about 60% of the length of the main body of the single crystal silicon ingot, over at least about 70% of the length of the main body of the single crystal silicon ingot, such as over at least about 80% of the length of the main body of the single crystal silicon ingot, or even over at least about 90% of the length of the main body of the single crystal silicon ingot are characterized by GOI yield (i.e., non-failure) in a MOS transistor at 95% or more, preferably 99% or more, at 8 MV (B-mode), and/or 95% or more, preferably 99% or more, at 10~12 MV (D-mode). In some embodiments, wafers sliced from ingots over at least about 60% of the length of the main body of the single crystal silicon ingot, grown over at least about 70% of the length of the main body of the single crystal silicon ingot, such as over at least about 80% of the length of the main body of the single crystal silicon ingot, or even over at least about 90% of the length of the main body of the single crystal silicon ingot by less than 20 COPs at no more than 0.026 um size to qualify as perfect silicon.

Figure 1B:
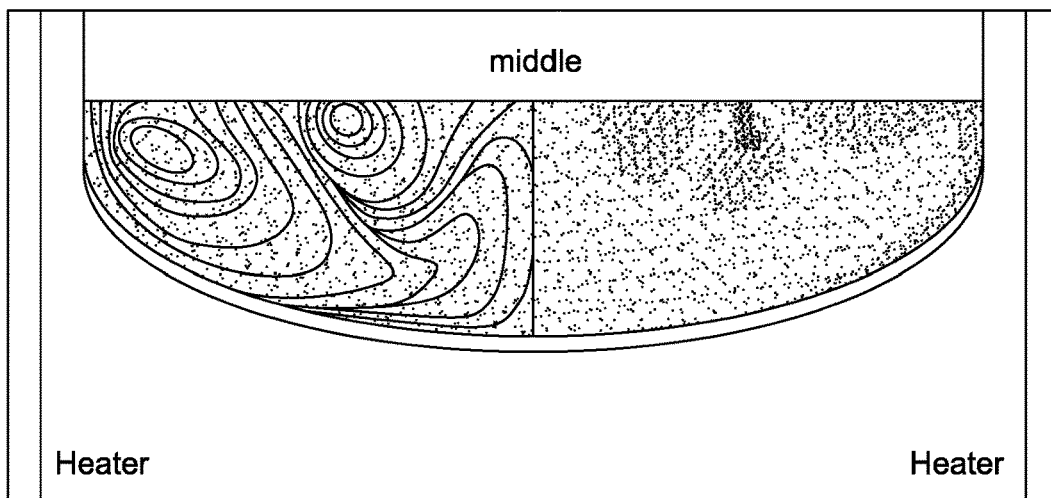
Figure 1C:
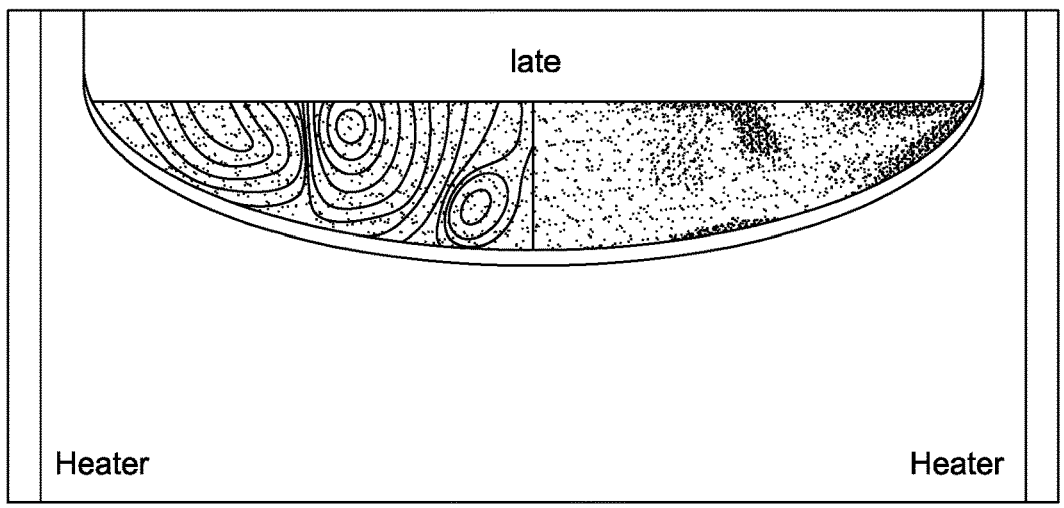
Figure 2A:
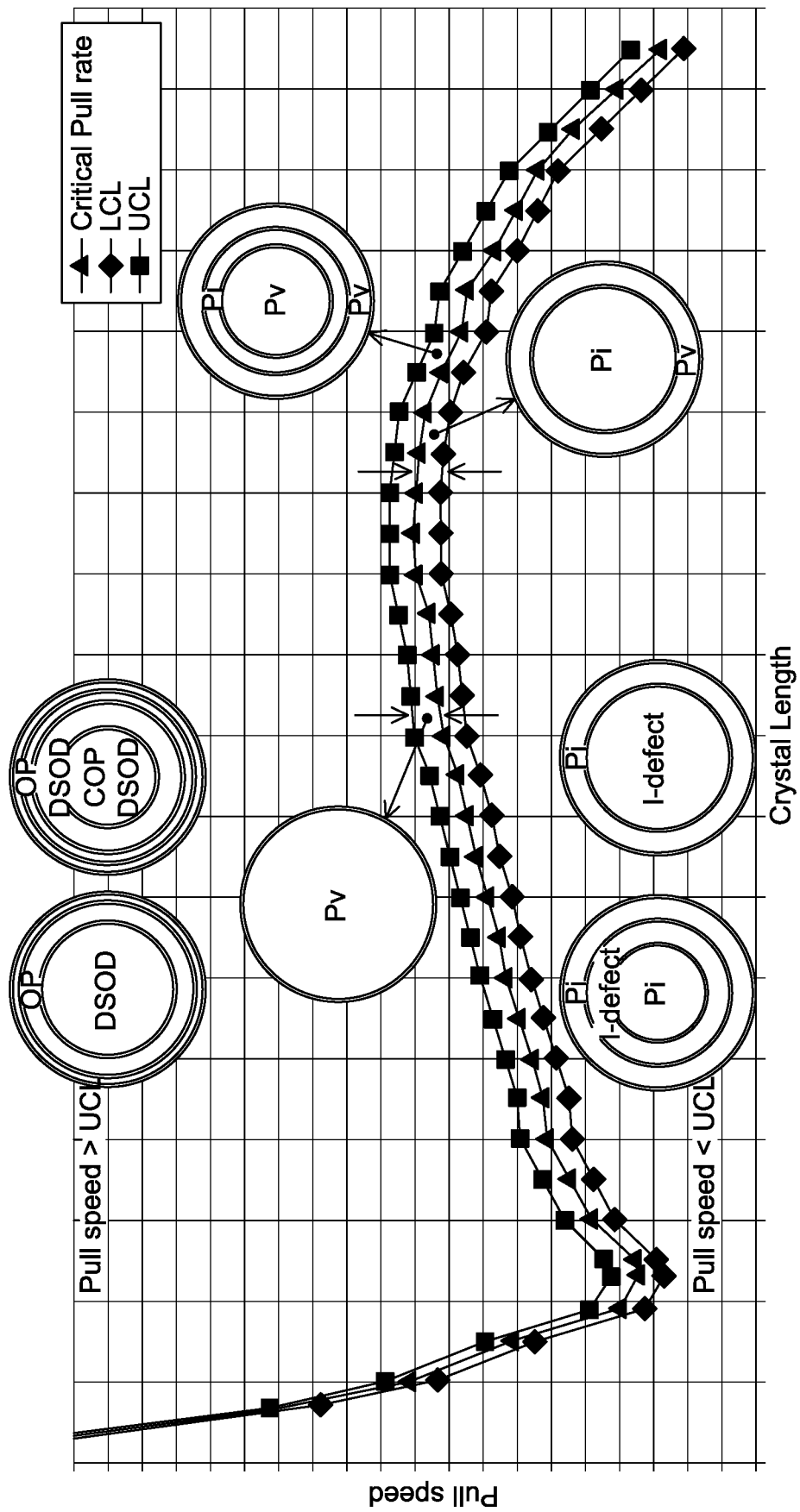
FIG. 2A is a graph depicting the constant change in pull rate required to achieve sufficient defectivity control in an ingot grown by an exemplary batch Cz process.

In a conventional batch Czochralski process to grow a single crystal silicon ingot, the crystal melt/interface and the thermal condition both vary continuously as a function of increasing ingot length due to the consumption of silicon melt during ingot growth and variability of the crucible position. A depiction of the melt depletion and the movement of the crucible may be found in FIG. 1. FIGS. 1A (early body growth), 1B (middle body growth), and 1C (late body growth) illustrate the melt level and crucible height as a function of crystal length during a batch Cz process. Since the melt conditions, e.g., mass and elevation levels, and the crucible location are continuously changing during a batch process, the v/G ratio (growth rate V/axial temperature gradient G) necessary to minimize defectivity is continuously changing over crystal length, shifting the quality of the crystal. In order to maintain the desired quality to meet specification within the process window, continuous control adjustment of several parameters is required by position. These parameters include crucible rotation rate (C/R), seed rotation rate (S/R), seed lift rate (S/L), heater power, reflector height, etc. See FIG. 2A, which is a graph depicting the constant change in pull rate required to achieve sufficient defectivity control in an ingot grown by an exemplary batch Cz process. The line defined by the triangle (-▲-) is the constantly changing critical pull rate to achieve the critical v/G value. The pull rate may vary within the upper critical pull rate ("UCL") marked by the square (-■-) and the lower critical pull rate ("LCL") marked by the diamond (-♦-) and still achieve acceptable defectivity control. These three lines indicate the pull speed that can produce perfect silicon. Within the upper and lower pull speed boundaries, perfect silicon may be produced having varying dominant intrinsic point defects. For example, vacancy dominant ("Pv") silicon is produced when the applied pull speed is controlled between the lines labelled with the Triangle and square in FIG. 2A (and FIGS. 3 and 4), and interstitial dominant ("Pi") silicon is produced when the applied pull speed is controlled between the lines labeled with the Triangle and diamond in FIG. 2A (and FIGS. 3 and 4). In the example depicted in FIG. 2A (and FIGS. 3 and 4), early and middle portions of ingot growth, perfect silicon having vacancy dominant point defects may be grown, as shown by the representation of the ingot cross section labeled "Pv." FIG. 2A depicts that the ingot is vacancy dominant from center to edge. In the example depicted in FIG. 2A, in later growth, the ingot is characterized by regions of vacancy dominant point defects and interstitial dominant point defects, which is represented in the cross section regions labeled "Pi." For example, an ingot may be grown that is interstitial dominant from center to a radial length less than the radius of the entire ingot, which is surrounded by a band of vacancy dominant material to the edge of the ingot. In a still later region, the cross section of the ingot shows vacancy dominant material in the center, surrounded by a band of interstitial dominant material, surrounded by another band of vacancy dominant material at the edge. These depictions are merely for illustration and are not intended to be limiting upon the method of the present disclosure. Perfect Silicon, i.e., ingots and wafers sliced therefrom that are free of detectable agglomerated point defects, results from the proper control of excess point defects (vacancy and interstitial silicon) in part by the pull rate of the ingot. Intrinsic point defects, such as vacancies and interstitials, occur in ingots grown by the Czocrhalski method. Presence of such defects has no impact on whether the silicon is perfect. Rather, perfect silicon is characterized as being free of agglomerated point defects, such as COPs, DSODs, and I-defects.

FIG. 2A (and also FIGS. 3 and 4A) also indicate the agglomerated defects which may result in the ingot as a function of pull speeds outside the upper and lower limits of critical v/G at any crystal length. The defects which may occur if the upper critical pull rate is exceeded (v/G is higher than a critical v/G) include DSOD (direct surface oxide defects) or COP (crystal originated pits or particles). Defects which may occur if the pull rate is below the lower critical pull rate (v/G is lower than a critical v/G) include I-defects. The bands in which these defects occur are also shown in the ingot cross sections. In regions wherein the dominant excess point defect is vacancies, agglomerations of vacancy defects form bulky defect such as COP, DSOD by agglomeration and precipitation of vacancies during the Cz silicon crystal growth and cooling. In regions wherein the dominant excess point defect is the interstitial silicon atoms, they agglomerate to form bulk defect such as I-defect by agglomeration/precipitation of interstitial silicon and punch out the dislocation. Any small deviation of v/G will form a defect by agglomeration of either vacancy or interstitial silicon atom.

Figure 2B:
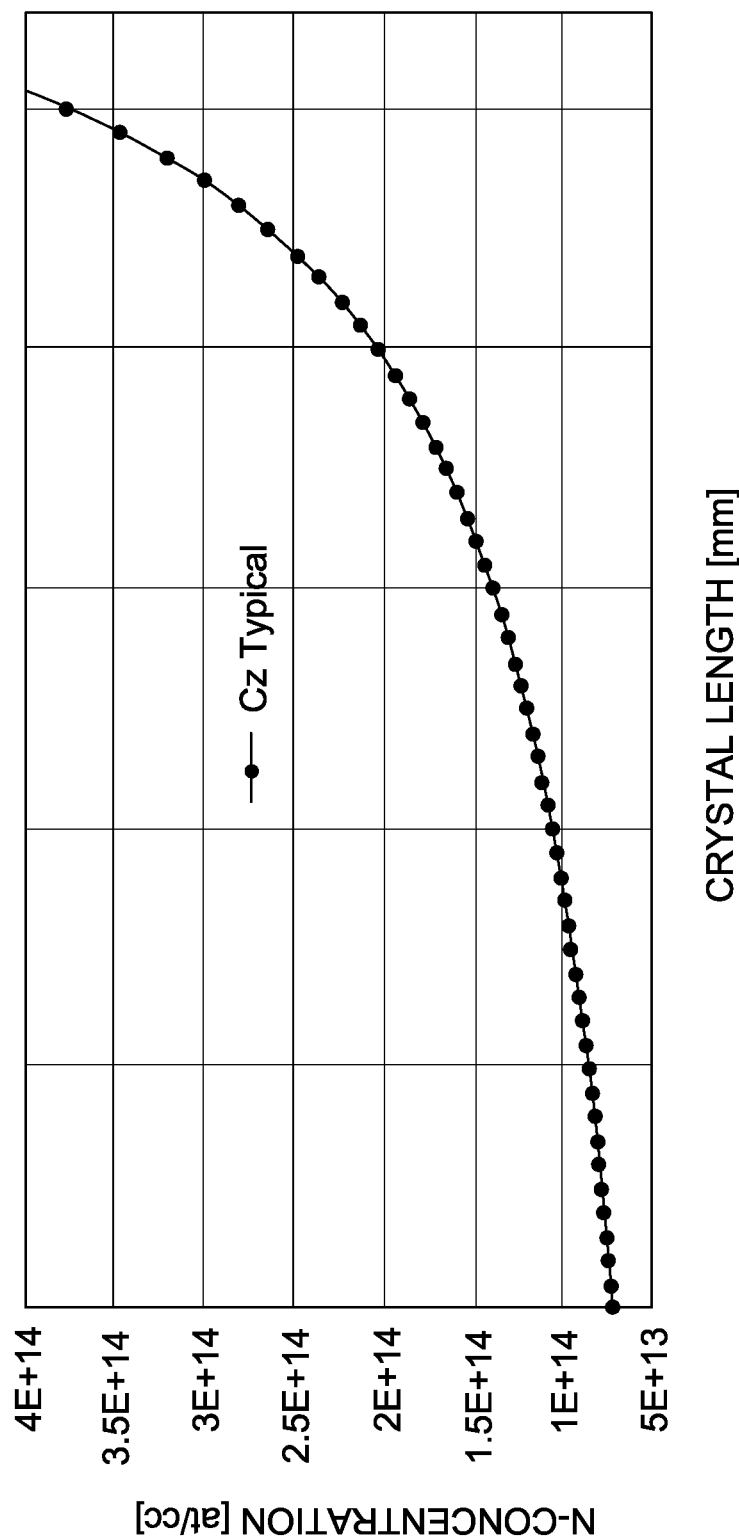
FIG. 2B is a graph depicting the change in nitrogen dopant concentration due to the segregation coefficient effect in an ingot grown by an exemplary batch Cz process.

In addition to substrate defectivity control, wafer strength is another important variable for certain applications, such as FLASH devices, in which higher wafer strength is advantageous due to vertical stacking of devices. In some techniques, wafer strength is provided by oxygen precipitation and manipulation of intrinsic gettering. For example, increasing oxygen content in the wafer is a predominant way to manipulate oxygen precipitation. In addition to oxygen content manipulation or instead of, the melt and the ingot grown therefrom may be doped with impurities such as nitrogen, which may manipulate both COP size and BMD density. Nitrogen doping may also provide a larger perfect silicon quality window vs. non-Nitrogen doped material. Nitrogen doping may segregate axially during growth due to a segregation coefficient effect. The nitrogen segregation coefficient is below unity and has been reported to be about $7 \times 10^{-4}$. Accordingly, nitrogen does not preferentially partition into the ingot during growth, which causes the nitrogen content in the melt to increase during the ingot pulling process, which thereby increases the nitrogen content along the axial length of the growing single crystal silicon ingot. See FIG. 2B, which is a graph depicting the increase of nitrogen concentration, which may be as much as 7× or more from the beginning of ingot growth to the end of ingot growth, that may occur along the axial length of a crystal prepared according to a batch Czochralski method with melt conditions as depicted in FIGS. 1A through 1C and process conditions as depicted in FIG. 2A. Nitrogen axial variation and changing crystal/melt interface and thermal conditions due to the change of crystal position during growth as poly Silicon is consumed (see FIGS. 1A through 1C) are barriers to maintaining good PS quality axially unless they are compensated for during growth through constant tuning of the crystal growth conditions. Because of this, v/G is continuously changing over crystal length, which may thereby shift the quality of the crystal.

Figure 3:
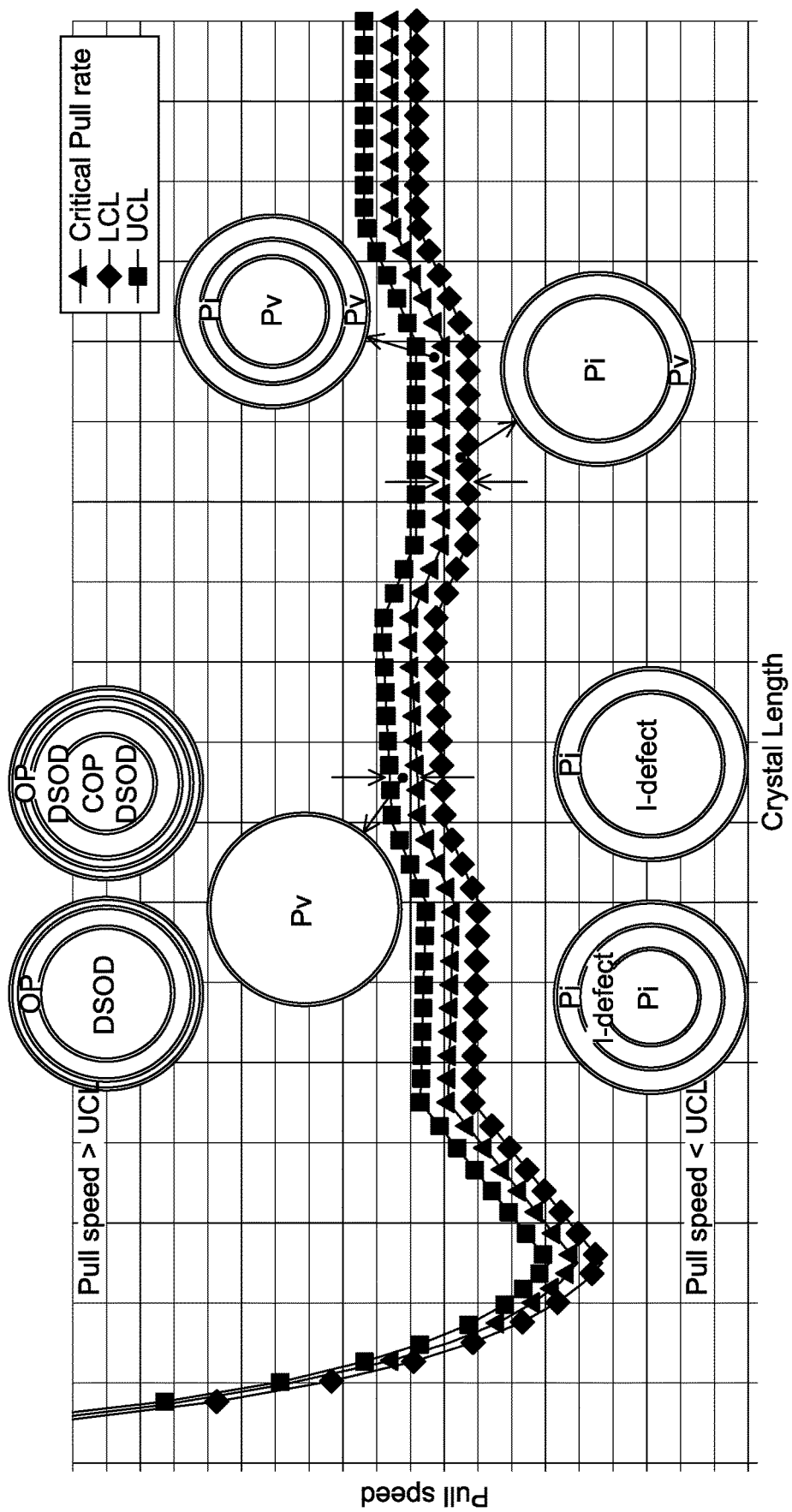
FIG. 3 is a graph depicting the pull rate profile required to achieve sufficient defectivity control in an ingot grown by an exemplary batch Cz process with an applied magnetic field.

Magnetic fields, e.g., horizontal or cusp, may be applied to alter the melt flow pattern within the crucible and enable enhanced control of the shape and height of the crystal/melt interface, which thereby enhances quality control. However, pull rates and other parameters must still be varied to achieve acceptable defectivity control, as exemplified in FIG. 3. FIG. 3 is a graph depicting the pull rate profiles required to achieve sufficient defectivity control in an ingot grown by an exemplary batch Cz process with an applied magnetic field. The line defined by the triangle (-▲-) is the critical pull rate to achieve the critical v/G value, which varies continuously during growth of the single crystal silicon ingot, as necessary. The pull rate may vary within the upper critical pull rate ("UCL") marked by the square (-■-) and the lower critical pull rate ("LCL") marked by the diamond (-♦-) and still achieve acceptable defectivity control. The regions of intrinsic point defect and agglomerated point defect in the cross section of the single crystal silicon ingot are substantially as described above in the description of FIG. 2A.

According to the method of the present disclosure, a single crystal silicon ingot is grown by the continuous Czochralski (CCZ) method under conditions that enable the melt depth (i.e., elevation level of the molten silicon) and thermal conditions to remain substantially constant during growth because melt is continuously replenished as it is consumed. In some embodiments, maintaining a substantially constant elevation level of the molten silicon enables maintaining the crucible in a fixed position. Once v/G is fixed with the appropriate hot zone configuration, the process window will be fixed (i.e., no control adjustment) over a substantial portion of the crystal length. Once the process conditions (S/R, power, gas flow and pressure, magnetic flux density, Cusp or HMCZ MGP position) are set, gas flow and/or chamber pressure and C/R are used to control oxygen content. Accordingly, the method of the present disclosure enables growth of a single crystal silicon ingot by the continuous Czochralski (CCZ) method in which the pull speed is constant during growth of a substantial length of the ingot, and the grown ingot according to this method has uniform and acceptable defectivity control, Oi uniformity, BMD uniformity, and nitrogen content uniformity over a substantial portion of the axial length of the ingot.

Figure 4A:
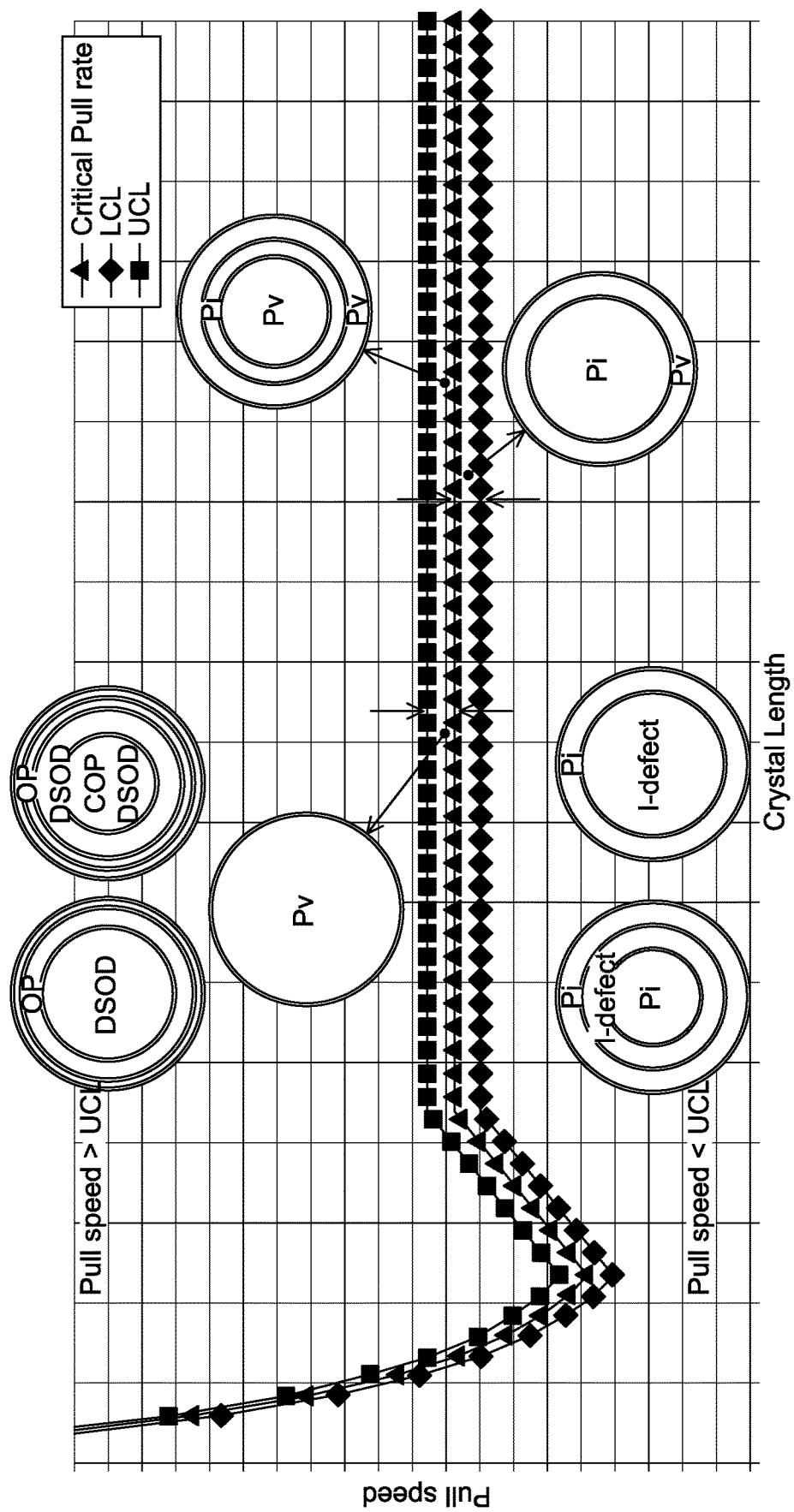
FIG. 4A is a graph depicting the pull rate profile required to achieve sufficient defectivity control in an ingot grown by an exemplary continuous Cz process according to the method of the present disclosure.
Figure 4B:
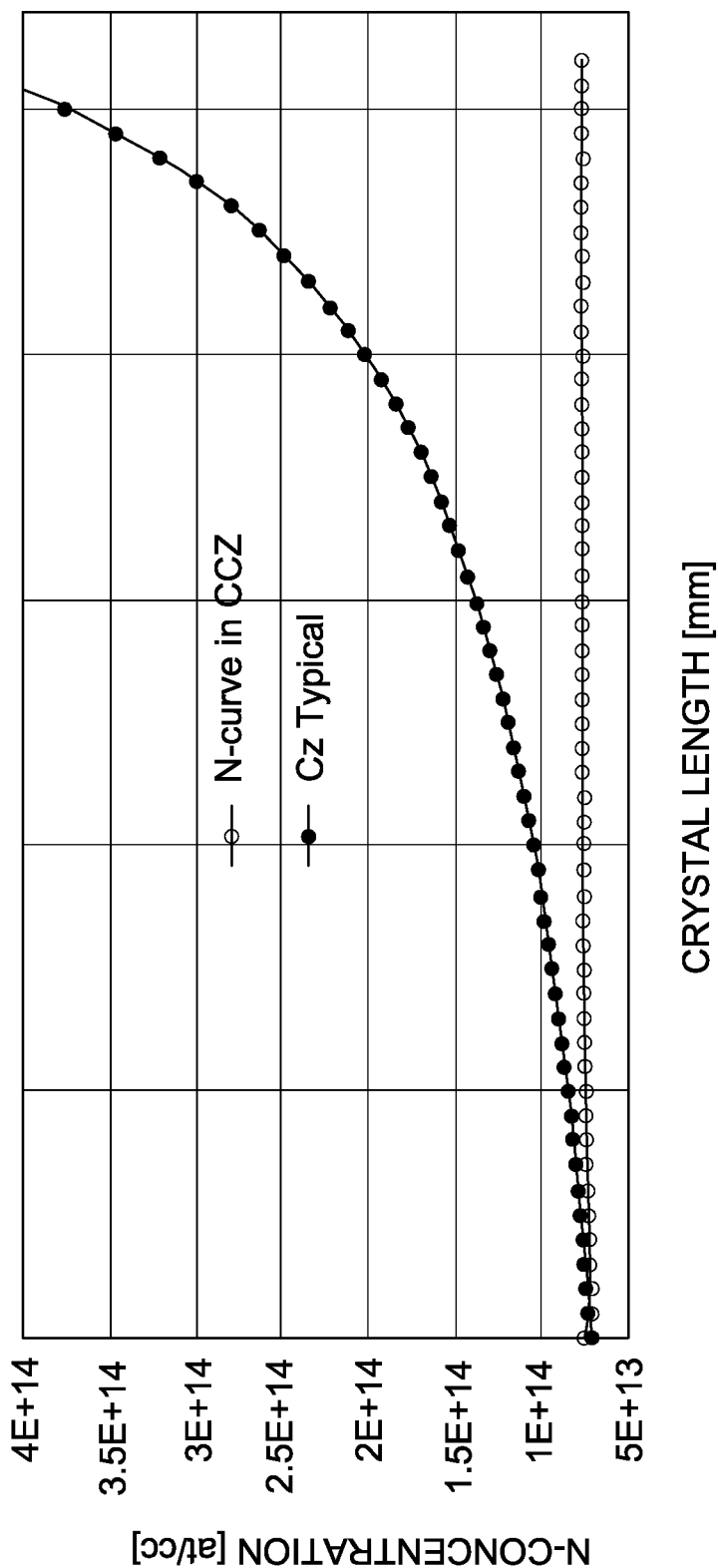
FIG. 4B is a graph comparing the nitrogen dopant concentration between an ingot grown by an exemplary batch Cz process and in an ingot grown by an exemplary continuous Cz process according to the method of the present disclosure.

After all conditions are set to steady state, the pull rate to produce a single crystal silicon ingot having the desired defectivity control in the entire crystal length will be constant, significantly reducing quality losses in production due to process control as compared to conventional Cz process. FIG. 4A is a graph of the pull rate as a function of axial length of the single crystal silicon ingot during an exemplary continuous Czochralski growth method according to the present disclosure. As shown in FIG. 4A, a constant pull rate is maintained over a substantial portion of the growth of the main body portion of the single crystal silicon ingot. The line defined by the triangle (-▲-) is the critical pull rate to achieve the critical v/G value, which has an initial varying region, followed by a region of constant pull rate over a substantial portion of the growth of the main body portion of the single crystal silicon ingot. The pull rate may vary within the upper critical pull rate ("UCL") marked by the square (-■-) and the lower critical pull rate ("LCL") marked by the diamond (-♦-) and still achieve acceptable defectivity control. The regions of intrinsic point defect and agglomerated point defect in the cross section of the single crystal silicon ingot are substantially as described above in the description of FIG. 2A.

In the CCZ process according to the method of the present disclosure, polycrystalline silicon feeding is continuous with the crystal growth, thereby the melt volume is maintained substantially the same as the initial charge melt depth regardless of crystal length. Since melt elevation is controlled by the mass balance between the growing crystal weight and the continuously fed polycrystalline silicon, the thermal condition in the melt and growing crystal is unchanged throughout the axial growth. Subsequently, once the desired crystal/melt interface is determined and fixed by parameters such as magnetic field, C/R and S/R, pull rate, heater power, etc., defect quality and Oi control will be maintained constant throughout the crystal axial growth. Further, because the thermal conditions and crystal/melt interface are fixed during the crystal growth, a constant pull rate for a given HZ and crystal/melt interface can be used over the entire crystal length in a quasi-steady state control.

According to the method of the present disclosure, the thermal condition suitable for achieving growth of the single crystal silicon ingot meeting the requirements for defectivity control is set by the hot zone configuration. The growth method is the continuous Czochralski method. Accordingly, the furnace chamber comprises means, e.g., a feeding tube, for continuous feeding of polycrystalline silicon. The solid polysilicon added to the crucible is typically granular polysilicon, although chunk poly silicon may be used, and it is fed into the crucible using a polysilicon feeder that is optimized for use with granular polysilicon. Chunk polysilicon typically has a size of between 3 and 45 millimeters (e.g., the largest dimension), and granular polysilicon typically has a size between 400 and 1400 microns. Granular polysilicon has several advantages including providing for easy and precise control of the feed rate due to the smaller size. However, the cost of granular polysilicon is typically higher than that of chunk polysilicon due to the chemical vapor deposition process or other manufacturing methods used in its production. Chunk polysilicon has the advantage of being cheaper and being capable of a higher feed rate given its larger size. The location of the heating units, cooling jacket, and operation of the power control are adjusted to accommodate the polycrystalline silicon feeder.

Figure 5:
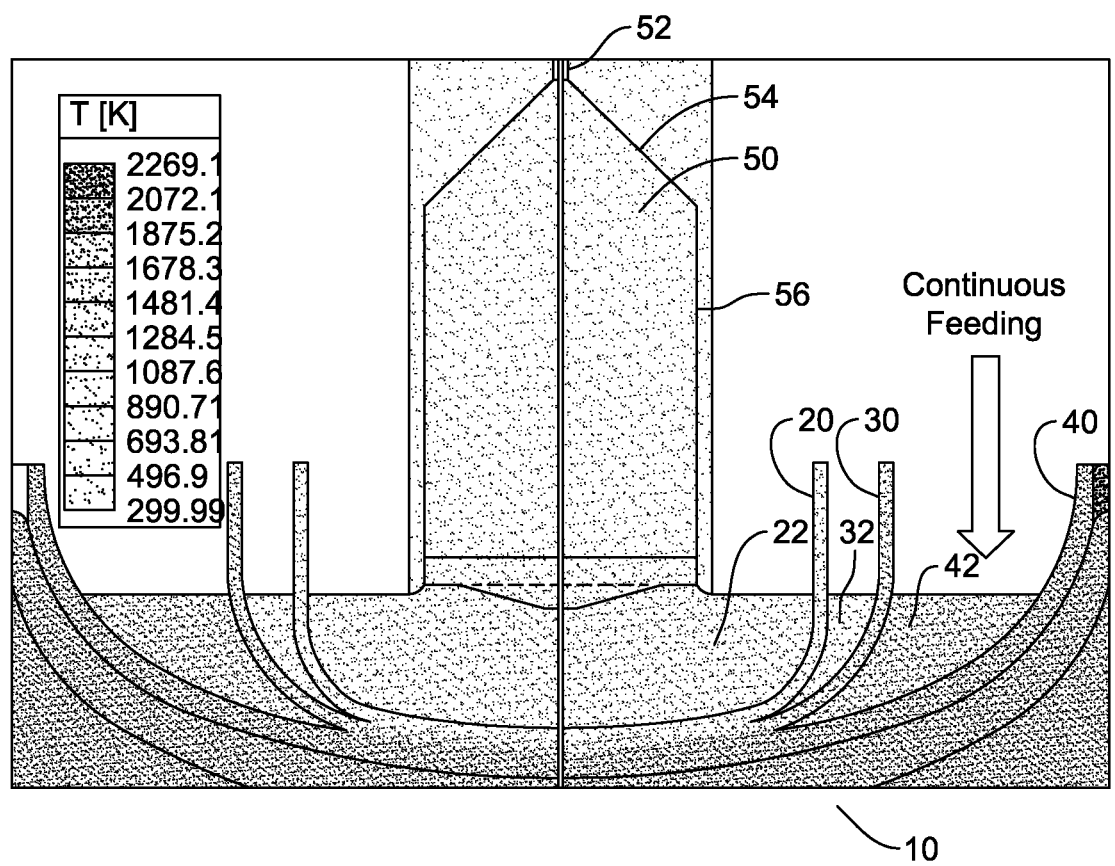
FIG. 5 depicts an exemplary crucible configuration suitable for an exemplary continuous Cz process according to the method of the present disclosure.

A depiction of a crucible 10 having a plurality of weirs (20, 30, 40) or fluid barriers that separate the melt into different melt zones is shown in FIG. 5. In the illustrated embodiment, the crucible assembly 10 includes a first weir 20 (broadly, a fluid barrier) defining the inner melt zone 22 of the silicon melt. The inner melt zone 22 is the growth region from which the single crystal silicon ingot 50 is grown. A second weir 30 defines a middle melt zone 32 of the silicon melt. Finally, a third weir 40 defines an outer melt zone 42 of the silicon melt. A feeding tube (not shown) feeds polycrystalline silicon, which may be granular, chunk, or a combination of granular and chunk, into the outer melt zone 42 at a rate sufficient to maintain a substantially constant melt elevation level and volume during growth of the ingot. The first weir 20, second weir 30, and third weir 40 each have a generally annular shape, and have at least one opening defined therein to permit molten silicon to flow radially inward towards the growth region of the inner melt zone 22. The crucible configuration depicted in FIG. 5 is exemplary and suitable for carrying out the process of the present disclosure. Other configurations suitable for CCZ may be used without departing from the scope of the present disclosure. For example, the crucible 10 may lack the second weir 30 and/or may lack the third weir 40.

Generally, the melt from which the ingot is drawn is formed by loading polycrystalline silicon into a crucible to form an initial silicon charge. In general, an initial charge is between about 100 kilograms and about 400 kilograms of polycrystalline silicon, such as between about 100 kilograms and about 300 kilograms of polycrystalline silicon, or between about 100 kilograms and about 200 kilograms of polycrystalline silicon, which may be granular, chunk, or a combination of granular and chunk. The mass of the initial charges depends on the desired crystal diameter and HZ design. Initial charge does not reflect the length of crystal, because polycrystalline silicon is continuously fed during crystal growth. For example, if polycrystalline silicon is fed continuously and the chamber height is tall enough, crystal length can be extended to 2000 mm, 3000 mm, or even 4000 mm in length. The crucible may have the configuration depicted in FIG. 5, or another configuration suitable for CCZ growth. A variety of sources of polycrystalline silicon may be used including, for example, granular polycrystalline silicon produced by thermal decomposition of silane or a halosilane in a fluidized bed reactor or polycrystalline silicon produced in a Siemens reactor.

In some embodiments, the melt is further charged with a source of nitrogen so that the single crystal silicon ingot grown according to the method of the present disclosure is doped with nitrogen. In some embodiments, the source of nitrogen is a solid source of nitrogen, such as silicon nitride. Silicon nitride may have the chemical formula $Si_XN_Y$, wherein X and Y are both 1 or one or both of X and Y are more than 1. Any form of silicon nitride may be used, with $Si_3N_4$ being the most common and stable. The silicon nitride may be granular or in the form of a powder. In some embodiments, the source of nitrogen is a silicon wafer having a silicon nitride film on a surface thereof. The silicon nitride film may be deposited on the silicon wafer by chemical vapor deposition to deposit, for example, a 0.5 to 10 micrometer thick film, such as about 1 micrometer thick film, on one or both sides of the wafer. The silicon wafer may be added whole or it may be crushed into small pieces. In some embodiments, the source of nitrogen is silicon oxynitride glass. In some embodiments, nitrogen doping may be accomplished by doping with a nitrogen containing gas, such as nitrogen ($N_2$) gas. To form the initial charge, the source of nitrogen, if a solid source is used, may be added directly to the polycrystalline silicon charge. As the single crystal silicon ingot is grown, the source of nitrogen is added, periodically or continuously, to maintain a uniform concentration of nitrogen in each portion of the single crystal silicon ingot.

The method of the present disclosure enables a uniform nitrogen concentration in each portion of the growing single crystal silicon ingot, including the neck portion, the outwardly flaring seed cone portion, and the main body of the single crystal silicon ingot. In some embodiments, the nitrogen concentration in each portion of the growing single crystal silicon ingot is at least about $1 \times 10^{13}$ atoms/cm$^3$, such as between about $1 \times 10^{13}$ atoms/cm$^3$ and about $1 \times 10^{15}$ atoms/cm$^3$, or between about $1 \times 10^{13}$ atoms/cm$^3$ and about $1.5 \times 10^{14}$ atoms/cm$^3$, or between about $5 \times 10^{13}$ atoms/cm$^3$ and about $1 \times 10^{14}$ atoms/cm$^3$. Preferably, the variation of the nitrogen concentration is not more than about 20% more than and not less than 20% less than the set point or average nitrogen concentration over the axial length of the single crystal silicon ingot. More preferably, the variation of the nitrogen concentration is not more than about 10% more than and not less than 10% less than the set point or average nitrogen concentration over the axial length of the single crystal silicon ingot. Even more preferably, the variation of the nitrogen concentration is not more than about 5% more than and not less than 5% less than the set point or average nitrogen concentration over the axial length of the single crystal silicon ingot. For example, if the set point, i.e., the target, nitrogen concentration is $7 \times 10^{13}$ atoms/cm$^3$, preferably, the concentration of nitrogen throughout the axial length of the single crystal silicon ingot is between about $5.67 \times 10^{13}$ atoms/cm$^3$ and about $8.47 \times 10^{13}$ atoms/cm$^3$, more preferably between about $6.3 \times 10^{13}$ atoms/cm$^3$ and about $7.7 \times 10^{13}$ atoms/cm$^3$, and even more preferably between about $6.65 \times 10^{13}$ atoms/cm$^3$ and about $7.35 \times 10^{13}$ atoms/cm$^3$. See FIG. 4B, which is a graph depicting the nitrogen concentration uniformity (line demarked by open circles ○) that may be achieved by periodic or continuous addition of nitrogen during an exemplary continuous Czochralski growth according to the method of the present disclosure. The uniformity may be compared to the increasing nitrogen concentration observed during a batch growth process (line demarked by dark circles ●). See also FIG. 2C. Preferably, uniform nitrogen concentration is achieved during growth of all portions of the ingot, including the neck portion, the outwardly flaring seed cone, and the main body. In some embodiments, uniform nitrogen concentration is achieved during growth of at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot.

Once polycrystalline silicon and a source of nitrogen is added to the crucible to form a charge, the charge is heated to a temperature above about the melting temperature of silicon (e.g., about 1412° C.) to melt the charge, and thereby form a silicon melt comprising molten silicon. The silicon melt has an initial volume of molten silicon and has an initial melt elevation level, and these parameters are determined by the size of the initial charge. In some embodiments, the crucible comprising the silicon melt is heated to a temperature of at least about 1425° C., at least about 1450° C. or even at least about 1500° C. The silicon melt further comprises a source of nitrogen sufficient to impart a nitrogen dopant concentration in the neck portion of the ingot of at least about $1 \times 10^{13}$ nitrogen atoms/cm$^3$. In some embodiments, silicon melt further comprises a source of nitrogen sufficient to impart a nitrogen dopant concentration in the neck portion of the ingot of between about $1 \times 10^{13}$ atoms/cm$^3$ and about $1 \times 10^{15}$ atoms/cm$^3$, or between about $1 \times 10^{13}$ atoms/cm$^3$ and about $1.5 \times 10^{14}$ atoms/cm$^3$, or between about $5 \times 10^{13}$ atoms/cm$^3$ and about $1 \times 10^{14}$ atoms/cm$^3$.

In general, there are no constraints on the resistivity of the single crystal silicon ingot. Accordingly, the resistivity of the single single crystal silicon ingot is based on the requirements of the end use/application of the structure of the present disclosure. The resistivity may therefore vary from milliohm or less to megaohm or more. In some embodiments, the crucible is doped with a p-type or an n-type dopant. Suitable dopants include boron (p type), gallium (p type), phosphorus (n type), antimony (n type), and arsenic (n type). The dopant concentration is selected based on the desired resistivity of a wafer sliced from the single crystal silicon ingot.

In some embodiments, the single crystal silicon ingot pulled according to the method of the present disclosure has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal silicon ingot has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), phosphorus (n type), antimony (n type), and arsenic (n type). In some embodiments, the dopants are added to the initial charge in the crucible and resistivity uniformity is maintained by continuous or periodic addition of dopants during crystal growth.

In some embodiments, the single crystal silicon ingot has a relatively high minimum bulk resistivity. The electrically active dopants, such as boron (p type), gallium (p type), aluminum (p type), indium (p type), phosphorus (n type), antimony (n type), and arsenic (n type), may be added to the crucible in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal silicon ingot has a minimum bulk resistivity of at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm. In some embodiments, the single crystal silicon ingot may comprise a p type dopant, such as boron, gallium, aluminum, or indium. In some embodiments, the single crystal silicon ingot may comprise an n type dopant, such as phosphorus, antimony, or arsenic. In some embodiments, the dopants are added to the initial charge in the crucible and resistivity uniformity is maintained by continuous or periodic addition of dopants during crystal growth. For example, in some embodiments, the main body portion has a resistivity that varies by no more than 20% above and no less than 20% below an average main body resistivity over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot. In some embodiments, the main body portion has a resistivity that varies by no more than 10% above and no less than 10% below an average main body resistivity over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot. In some embodiments, the main body portion has a resistivity that varies by no more than 5% above and no less than 5% below an average main body resistivity over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot.

Once the charge is liquefied to form a silicon melt comprising molten silicon, the silicon seed crystal is lowered to contact the melt. The silicon seed crystal is then withdrawn from the melt with silicon being attached thereto (i.e., the seed crystal portion and neck 52, with reference to FIG. 5) thereby forming a melt-solid interface near or at the surface of the melt. Generally, the initial pull speed to form the neck portion is high. In some embodiments, the silicon seed crystal and neck portion is withdrawn at a neck portion pull rate of at least about 1.0 mm/minute, such as between about 1.5 mm/minute and about 6 mm/minute, such as between about 3 mm/minute and about 5 mm/minute. In some embodiments, the silicon seed crystal and the crucible are rotated in opposite directions, i.e., counter-rotation. Counter-rotation achieves convection in the silicon melt. Rotation of crystal is mainly used to provide a symmetric temperature profile, suppress angular variation of impurities and also to control crystal melt interface shape. In some embodiments, the silicon seed crystal is rotated at a rate of between about 5 rpm and about 30 rpm, or between about 5 rpm and about 20 rpm, or between about 8 rpm and about 20 rpm, or between about 10 rpm and about 20 rpm. In some embodiments, the crucible is rotated at a rate between about 0.5 rpm and about 10 rpm, or between about 1 rpm and about 10 rpm, or between about 4 rpm and about 10 rpm, or between about 5 rpm and about 10 rpm. In some embodiments, the seed crystal is rotated at a faster rate than the crucible. In some embodiments, the seed crystal is rotated at a rate that is at least 1 rpm higher than the rotation rate of the crucible, such as at least about 3 rpm higher, or at least about 5 rpm higher. Conventionally, the crystal rotation rate is higher than the crucible rotation rate, to favor a good radial uniformity of the dopant concentration in the crystal. In some embodiments, the silicon seed crystal and the crucible are rotated in opposite directions, i.e., counter-rotation.

In general, the neck portion has a length between about 10 millimeters and about 700 millimeters, between about 30 millimeters and about 700 millimeters, between about 100 millimeters and about 700 millimeters, between about 200 millimeters and about 700 millimeters, or between about 300 millimeters and about 700 millimeters. In some embodiments, the neck portion has a length between about 10 millimeters and about 100 millimeters, such as between about 20 and about 50 millimeters. In some embodiments, the neck portion has a length between about 350 millimeters and about 550 millimeters. In some embodiments, the neck portion has a length between about 450 millimeters and about 550 millimeters. However, the length of the neck portion may vary outside these ranges. In some embodiments, the neck portion has a diameter between about 1 mm and about 10 mm, between about 2.5 mm and about 6.5 mm, such as between about 3 mm and about 6 mm. Since the silicon melt is doped with nitrogen, the neck portion 52 of the ingot is doped with nitrogen. In some embodiments, the neck portion 52 has a neck portion nitrogen concentration of at least about $1 \times 10^{13}$ atoms/cm$^3$. In some embodiments, the neck portion 52 has a nitrogen concentration between about $1 \times 10^{13}$ atoms/cm$^3$ and about $1 \times 10^{15}$ atoms/cm$^3$, or between about $1 \times 10^{13}$ atoms/cm$^3$ and about $1.5 \times 10^{14}$ atoms/cm$^3$, or between about $5 \times 10^{13}$ atoms/cm$^3$ and about $1 \times 10^{14}$ atoms/cm$^3$. Preferably, the variation of the nitrogen concentration is not more than about 20% more than and not less than 20% less than the set point or average nitrogen concentration over the axial length of the neck portion. More preferably, the variation of the nitrogen concentration is not more than about 10% more than and not less than 10% less than the set point or average nitrogen concentration over the axial length of the neck portion. Even more preferably, the variation of the nitrogen concentration is not more than about 5% more than and not less than 5% less than the set point or average nitrogen concentration over the axial length of the neck portion.

After formation of the neck, the outwardly flaring seed-cone portion 54 adjacent the neck 52 is grown, with reference to FIG. 5. In general, the pull rate is decreased from the neck portion pull rate to a rate suitable for growing the outwardly flaring seed-cone portion. For example, the seed-cone pull rate during growth of the outwardly flaring seed-cone is between about 0.5 mm/min and about 2.0 mm/min, such as about 1.0 mm/min. In some embodiments, the outwardly flaring seed-cone 54 has a length between about 100 millimeters and about 400 millimeters, such as between about 150 millimeters and about 250 millimeters. The length of the outwardly flaring seed-cone 54 may vary outside these ranges. In some embodiments, the outwardly flaring seed-cone 54 is grown to a terminal diameter of about 150 mm, at least about 150 millimeters, about 200 mm, at least about 200 millimeters, about 300 mm, at least about 300 mm, about 450 mm, or even at least about 450 mm. The terminal diameter of the outwardly flaring seed-cone 54 is generally equivalent to the diameter of the constant diameter of the main body of the single crystal silicon ingot. According to the method of the present disclosure, the outwardly flaring seed-cone 54 of the ingot is doped with nitrogen. In some embodiments, outwardly flaring seed-cone 54 has an outwardly flaring seed-cone nitrogen concentration of at least about $1 \times 10^{13}$ atoms/cm$^3$. In some embodiments, the outwardly flaring seed-cone 54 has a nitrogen concentration between about $1 \times 10^{13}$ atoms/cm$^3$ and about $1 \times 10^{15}$ atoms/cm$^3$, or between about $1 \times 10^{13}$ atoms/cm$^3$ and about $1.5 \times 10^{14}$ atoms/cm$^3$, or between about $5 \times 10^{13}$ atoms/cm$^3$ and about $1 \times 10^{14}$ atoms/cm$^3$. Preferably, the variation of the nitrogen concentration in the outwardly flaring seed-cone 54 is not more than about 20% more than and not less than 20% less than the set point nitrogen concentration. More preferably, the variation of the nitrogen concentration in the outwardly flaring seed-cone 54 is not more than about 10% more than and not less than 10% less than the set point nitrogen concentration. Even more preferably, the variation of the nitrogen concentration in the outwardly flaring seed-cone 54 is not more than about 5% more than and not less than 5% less than the set point nitrogen concentration. With reference again to FIG. 4B, nitrogen concentration uniformity is preferably achieved according to an exemplary method according to the present disclosure during growth of all portions of the ingot, including the outwardly flaring seed-cone.

After formation of the neck and the outwardly flaring seed-cone adjacent the neck portion, the main ingot body 56 having a constant diameter adjacent the cone portion is then grown. The constant diameter portion of the main body 56 has a circumferential edge, a central axis that is parallel to the circumferential edge, and a radius that extends from the central axis to the circumferential edge. The central axis also passes through the cone portion and neck 52. The diameter of the main ingot body may vary and, in some embodiments, the diameter may be about 150 mm, at least about 150 millimeters, about 200 mm, at least about 200 millimeters, about 300 mm, at least about 300 mm, about 450 mm, or even at least about 450 mm. In some embodiments, the main body of the single crystal silicon ingot is eventually grown to be at least about 1000 millimeters long, such as at least 1100 millimeters long, such as at least 1200 millimeters long, such as at least 1400 millimeters long, such as at least 1500 millimeters long, such as at least 1700 millimeters long, or at least 1900 millimeters long, or at least 2000 millimeters long, or at least 2200 millimeters, or at least about 3000 millimeters long, or at least about 4000 millimeters long. According to the method of the present disclosure, the main body 56 of the ingot is doped with nitrogen. In some embodiments, main body 56 has a main body nitrogen concentration of at least about $1 \times 10^{13}$ atoms/cm$^3$. In some embodiments, the main body 56 has a nitrogen concentration between about $1 \times 10^{13}$ atoms/cm$^3$ and about $1 \times 10^{15}$ atoms/cm$^3$, or between about $1 \times 10^{13}$ atoms/cm$^3$ and about $1.5 \times 10^{14}$ atoms/cm$^3$, or between about $5 \times 10^{13}$ atoms/cm$^3$ and about $1 \times 10^{14}$ atoms/cm$^3$. Preferably, the variation of the nitrogen concentration in the main body 56 is not more than about 20% more than and not less than 20% less than the set point nitrogen concentration. More preferably, the variation of the nitrogen concentration in the main body 56 is not more than about 10% more than and not less than 10% less than the set point nitrogen concentration. Even more preferably, the variation of the nitrogen concentration in the main body 56 is not more than about 5% more than and not less than 5% less than the set point nitrogen concentration. With reference again to FIG. 4B, nitrogen concentration uniformity is preferably achieved according to an exemplary method according to the present disclosure during growth of all portions of the ingot, including the main body portion. In some embodiments, the main body comprises nitrogen at a main body nitrogen concentration that varies by no more than 20% above and no less than 20% below an average main body nitrogen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot. In some embodiments, the main body comprises nitrogen at a main body nitrogen concentration that varies by no more than 10% above and no less than 10% below an average main body nitrogen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot. In some embodiments, the main body comprises nitrogen at a main body nitrogen concentration that varies by no more than 5% above and no less than 5% below an average main body nitrogen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot.

FIG. 4A illustrates an exemplary and non-limiting pull rate protocol for pulling the main body of the single crystal silicon ingot according to some embodiments of the method of the present disclosure. As is apparent from the exemplary illustration, the pull rate declines from a relatively high pull rate, to a minimum pull rate, and then rising to a constant pull rate for a significant portion of growth of the main body of the single crystal silicon ingot. According to the process of the present disclosure, the pull rates are selected to achieve perfect silicon, i.e., silicon characterized by a lack detectable agglomerated defects selected from among agglomerated defects, DSOD (direct surface oxidation defects), COP (crystal originated pits), D-Defects, and I-defects, etc. The initial high pull rate may be between about 0.5 mm/min and about 2.0 mm/min, such as about 1.0 mm/min, then decreasing to a pull rate that may be as low as about 0.4 mm/min or even as low as about 0.3 mm/min, before increasing to the constant pull rate between about 0.4 mm/min and about 0.8 mm/min, between about 0.4 mm/min and about 0.7 mm/min, or between about 0.4 mm/min and about 0.65 mm/min.

Figures 6A, 6B, 6C:
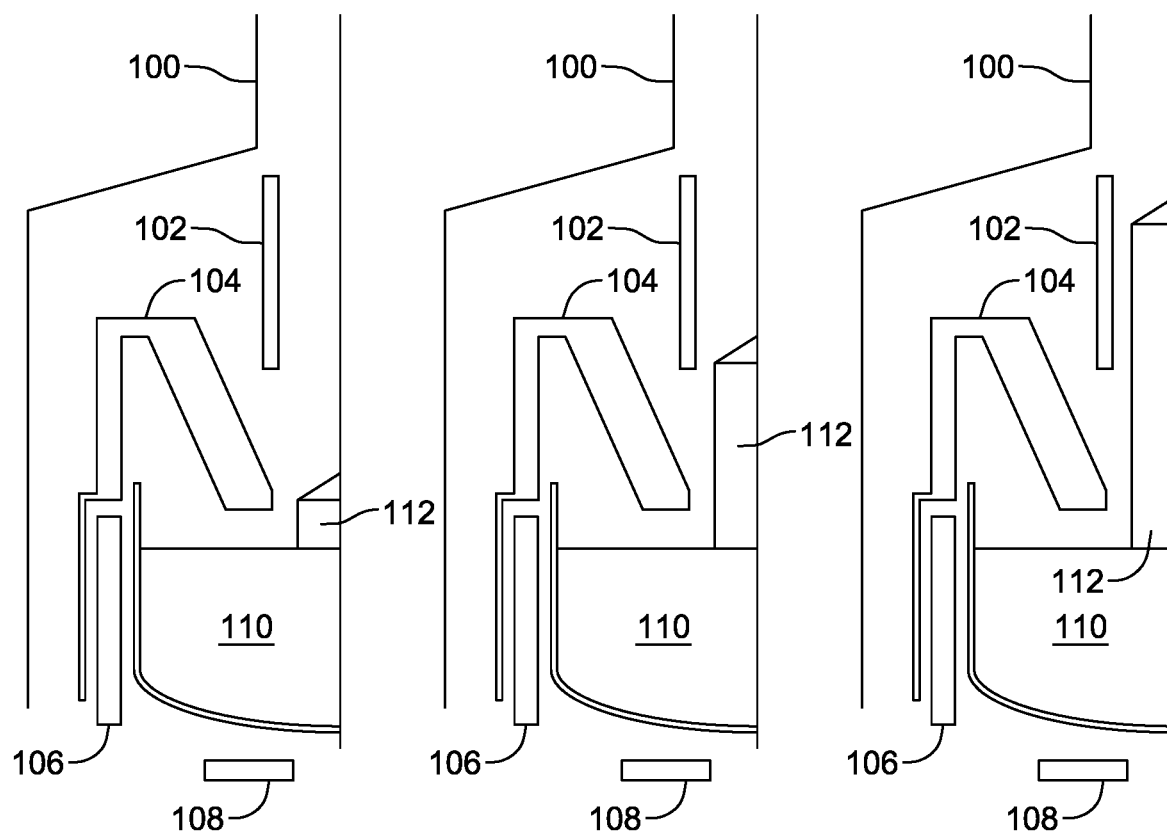
FIGS. 6A, 6B, and 6C illustrate the melt level and ingot growth an exemplary continuous Cz process according to the method of the present disclosure.

An exemplary and non-limiting illustration of a hot zone configuration within a furnace chamber 100 suitable for carrying out the method of the present disclosure is depicted in FIGS. 6A, 6B, and 6C. Other hot zone configurations are suitable for carrying out the method of the present disclosure. The hot zone configuration includes a cooling jacket 102, a reflector 104, a side heater 106, and a bottom heater 108. The growing crystal diameter and the shape and height of the meniscus is monitored by a camera (not pictured) located at the top window. Data obtained from the camera enables feedback to the side heater 106 and bottom heater 108. During crystal growth, the power distribution may be adjusted between the heaters to enable uniformity of the melt/solid interface, i.e., maintain the desired shape and height of the meniscus. The reflector 104 should reflect the heat flux from the hot part of the furnace including the heater and crucible to the melt. The reflector 104 reduces heat transfer from the hot part to the cold part (maintained by the cooling jacket 102) of the furnace and thereby maintains a separation between these two regions of the furnace. The reflector helps control the axial and radial temperature gradients, which drive the solidification and crystallization of the molten silicon into the growing ingot.

FIGS. 6A, 6B, and 6C depict a $1^{st}$ step, $2^{nd}$ step, and $3^{rd}$ step, respectively, corresponding to the regions of pull rate shown in FIG. 4A. That is, the $1^{st}$ step depicted in FIG. 6A corresponds to the region wherein the pull rate is high and decreases to a minimum in FIG. 4A. The $2^{nd}$ step depicted in FIG. 6B corresponds to the region wherein the pull rate is at a minimum and increases to the constant pull rate in FIG. 4A. The $3^{rd}$ step depicted in FIG. 6C corresponds to the region of constant pull rate in FIG. 4A. During each step, the melt 110 retains a constant melt volume and melt elevation level according to embodiments of the present disclosure since polycrystalline silicon is continuously fed into the melt (see FIG. 5) during growth of the ingot 112.

The initial region of growing the main body of the single crystal silicon ingot characterized by variable pull rate may encompass less than about 20% of the total length of the main body of the single crystal silicon ingot. In some embodiments, the variable pull rate regime may encompass between about 5% and about 20% of the length of the main body of the single crystal silicon ingot, such as between about 5% and about 15% of the length of the main body of the single crystal silicon ingot, or between about 10% and about 15% of the length of the main body of the single crystal silicon ingot. The percentage of the length of the main body of the single crystal silicon ingot grown under variable pull rate conditions depends in part on the total length of the main body of the ingot. For example, the length of the main body of the ingot pulled under variable rate conditions may vary between about 50 mm to about 200 mm between about 100 mm to about 200 mm, such as between about 150 mm to about 200 mm. If 200 mm is grown under variable rate conditions, and the total length of the main body of the ingot is 1400 mm, about 14% of the main body is grown under variable rate conditions, while only about 9% of the main body is grown under variable rate conditions for a total main body length of 2200 mm.

After the initial region of the main body is grown under variable pull rate conditions, the remainder of the main body is grown under a constant pull rate. In some embodiments, the main body of the ingot is grown at a constant main body pull rate during growth of at least about 30% of the length of the main body of the single crystal silicon ingot, such as at least about 50% of the length of the main body of the single crystal silicon ingot, at least about 70% of the length of the main body of the single crystal silicon ingot, at least about 80% of the length of the main body of the single crystal silicon ingot, or even at least about 90% of the length of the main body of the single crystal silicon ingot. In some embodiments, the constant main body pull rate is between about 0.4 mm/min and about 0.8 mm/min, between about 0.4 mm/min and about 0.7 mm/min, or between about 0.4 mm/min and about 0.65 mm/min.

During growth of the main body of the single crystal silicon ingot, polycrystalline silicon, i.e., granular, chunk, or a combination of granular and chunk, is added to the molten silicon to thereby achieve a constant volume of molten silicon and constant melt elevation level. According to the method of the present disclosure, maintenance of a substantially constant melt volume during growth of a substantial portion of the axial length of the main body of the single crystal silicon ingot enables the achievement of high ingot quality over a substantial portion of the axial length of the main body of the single crystal silicon ingot at a constant pull rate. The constant melt volume regardless of the crystal length enables maintaining a constant crystal/melt interface and thus uniform crystal quality over a substantial portion of the main body of the ingot. Accordingly, in some embodiments, the volume of molten silicon varies by no more than about 1.0 volume % during growth of at least about 90% the main body of the single crystal silicon ingot, or by no more than about 0.5 volume % during growth of at least about 90% the main body of the single crystal silicon ingot, or even by no more than about 0.1 volume % during growth of at least about 90% the main body of the single crystal silicon ingot. Stated another way, in some embodiments, the melt elevation level varies by less than about +/−0.5 millimeter during growth of at least about 90% the main body of the single crystal silicon ingot.

During growth of the main body of the single crystal silicon ingot, the melt is further charged with a source of nitrogen so that the single crystal silicon ingot grown according to the method of the present disclosure is doped with nitrogen. In some embodiments, the source of nitrogen is a solid source of nitrogen, such as silicon nitride. The silicon nitride may be in the form of a powder. In some embodiments, the source of nitrogen is a silicon wafer having a silicon nitride film on a surface thereof. The silicon nitride film may be deposited on the silicon wafer by chemical vapor deposition to deposit, for example, a 0.5 to 10 micrometer, such as about 1 micrometer thick film on both sides of the wafer. The silicon wafer may be added whole or it may be crushed into small pieces. In some embodiments, the source of nitrogen is silicon oxynitride glass. In some embodiments, nitrogen doping may be accomplished by doping with a nitrogen containing gas, such as nitrogen ($N_2$) gas. During growth of the ingot, according to the method of the present disclosure, the source of nitrogen may be added, along with polycrystalline silicon, to the third weir 40, as depicted in FIG. 5.

The method of the present disclosure is suitable for achieving axially uniform nitrogen concentrations during growth of the neck portion, seed cone, and main body portions of the single crystal silicon ingot. See FIG. 4B for a depiction of the uniformity that may be achieved by continuous or periodic addition of nitrogen during the growth of the ingot according to the continuous Czochralski technique of the present disclosure. The uniformity, which overcomes the segregation normally found in nitrogen doping single crystal silicon ingots, is achieved by an auto-doping system that continuously or periodically adds a source of nitrogen to the melt. The source of nitrogen may be added continuously or periodically during the growth of the ingot, including each of the neck portion, seed cone, and main body portions. In some embodiment, for uniformity and ease of processing, periodic additions, e.g., during every 25 mm, 50 mm, 75 mm, or 100 mm of axial length during ingot growth, of the source of nitrogen are preferred. Periodic additions, e.g., during every 25 mm, 50 mm, 75 mm, or 100 mm of axial length during ingot growth, of the source of nitrogen are also preferred in order to enhance attainment of perfect silicon during growth of the axial length of the ingot.

Figure 7:
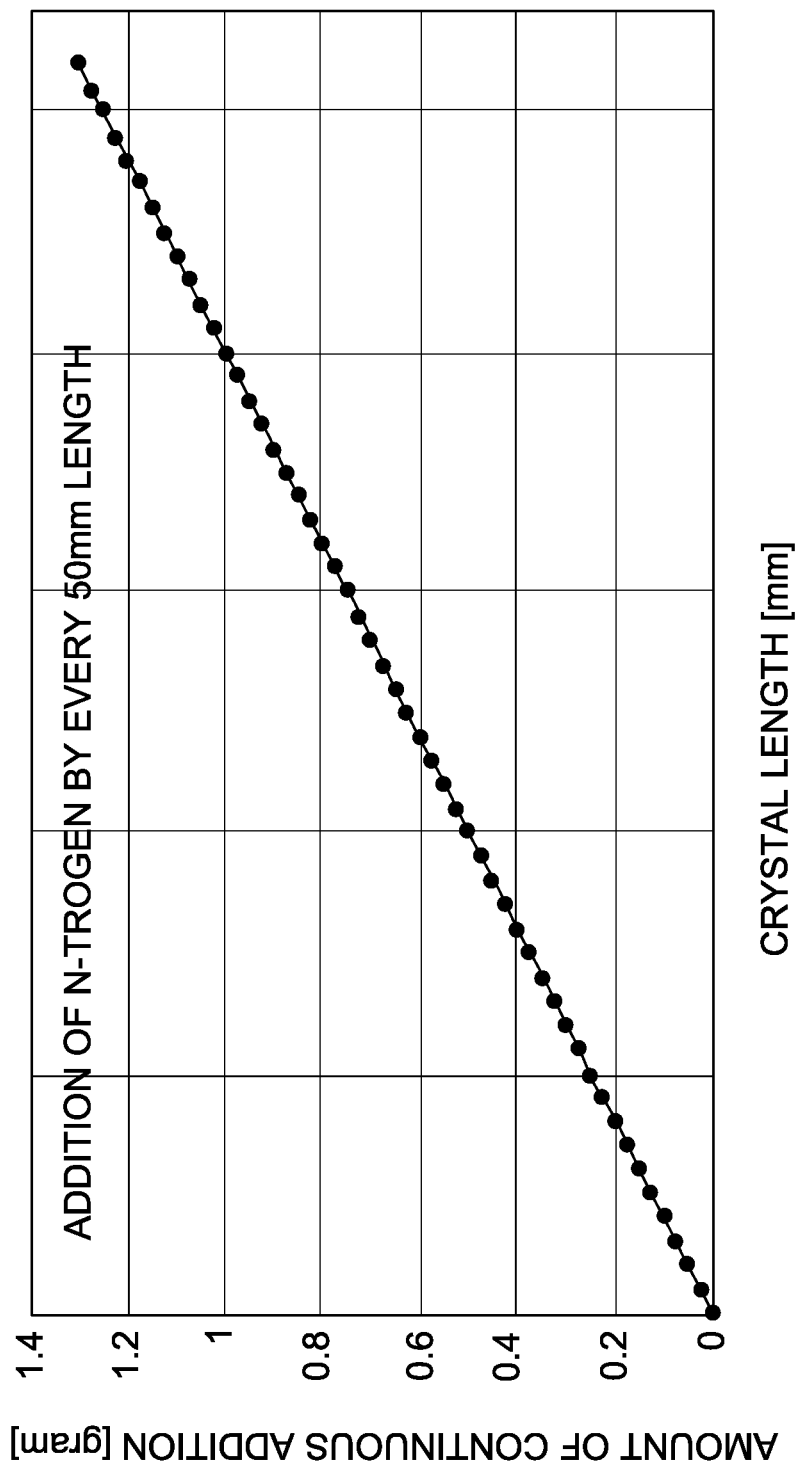
FIG. 7 is a graph depicting a nitrogen source addition protocol into a melt to grow an ingot grown by an exemplary continuous Cz process according to the method of the present disclosure.

In some embodiments, the source of nitrogen is continuously fed or periodically fed to the crucible in an amount between about 1 milligram nitrogen and about 100 milligrams nitrogen per 50 mm of axial length of the main body of the single crystal silicon ingot, or between about 1 milligram nitrogen and about 25 milligrams nitrogen per 50 mm of axial length of the main body of the single crystal silicon ingot, or between about 2 milligrams nitrogen and about 15 milligrams nitrogen per 50 mm of axial length of the main body of the single crystal silicon ingot. In some embodiments, the source of nitrogen is silicon nitride, which may be added as a powder. In some embodiments, silicon nitride is continuously fed or periodically fed to the crucible during growth of the main body of the single crystal silicon ingot in an amount between about 2.5 milligrams silicon nitride and 250 milligrams silicon nitride per 50 mm of axial length of the main body of the single crystal silicon ingot, or between about 5 milligrams silicon nitride and 100 milligrams silicon nitride per 50 mm of axial length of the main body of the single crystal silicon ingot, or between about 10 milligrams silicon nitride and 50 milligrams silicon nitride per 50 mm of axial length of the main body of the single crystal silicon ingot. In some exemplary embodiments, between about 10 milligrams and about 50 milligrams, such as about 25 milligrams silicon nitride may be added per 50 mm of axial length of a main body having a nominal diameter of about 310 millimeters. The amount of silicon nitride added may be scaled up or down depending upon the nominal diameter of the ingot. For example, between about 1 milligrams and about 10 milligrams, such as about 5 or 6 milligrams silicon nitride may be added per 50 mm of axial length of a main body having a nominal diameter of about 150 millimeters. In yet another example, between about 25 milligrams and about 75 milligrams, such as between about 45 milligrams and about 60 milligrams silicon nitride may be added per 50 mm of axial length of a main body having a nominal diameter of about 450 millimeters. An exemplary feeding protocol displaying total additions of silicon nitride as a function of axial length of the single crystal silicon ingot is depicted in FIG. 7.

In some embodiments, the source of nitrogen is added during growth to achieve a main body nitrogen concentration between about $1\times10^{13}$ atoms/cm$^3$ and about $1\times10^{15}$ atoms/cm$^3$, or between about $1\times10^{13}$ atoms/cm$^3$ and about $1.5\times10^{14}$ atoms/cm$^3$, or between about $5\times10^{13}$ atoms/cm$^3$ and about $1\times10^{14}$ atoms/cm$^3$. In some embodiments, the source of nitrogen is added during growth to achieve a main body nitrogen concentration between about $5\times10^{13}$ atoms/cm$^3$ and about $1\times10^{14}$ atoms/cm$^3$, over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot, or even at the entire axial length of the main body of the single crystal silicon ingot.

In some embodiments, the source of nitrogen is added during growth to achieve a main body nitrogen concentration between about $1\times10^{13}$ atoms/cm$^3$ and about $1.5\times10^{14}$ atoms/cm$^3$, or between about $5\times10^{13}$ atoms/cm$^3$ and about $1\times10^{14}$ atoms/cm$^3$ and further wherein the main body nitrogen concentration varies by no more than 20% above and no less than 20% below a set point or an average main body nitrogen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot, or even at the entire axial length of the main body of the single crystal silicon ingot. More preferably, the variation of the nitrogen concentration in the main body 56 is not more than about 10% more than and not less than 10% less than the set point nitrogen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the single crystal silicon ingot, or at least 90% of axial length of the main body of the single crystal silicon ingot, or even at the entire axial length of the main body of the single crystal silicon ingot. Even more preferably, the variation of the nitrogen concentration in the main body 56 is not more than about 5% more than and not less than 5% less than the set point nitrogen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot, or even at the entire axial length of the main body of the single crystal silicon ingot.

In some embodiments, the source of nitrogen is added during growth to achieve a main body nitrogen concentration between about $5 \times 10^{13}$ atoms/cm$^3$ and about $1 \times 10^{14}$ atoms/cm$^3$ and further wherein the main body nitrogen concentration varies by no more than 20% above and no more than 20% below a set point or an average main body nitrogen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot. More preferably, the variation of the nitrogen concentration in the main body 56 is not more than about 10% more than and not less than 10% less than the set point nitrogen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot, or even at the entire axial length of the main body of the single crystal silicon ingot. Even more preferably, the variation of the nitrogen concentration in the main body 56 is not more than about 5% more than and not less than 5% less than the set point nitrogen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot, or even at the entire axial length of the main body of the single crystal silicon ingot.

Additionally, according to the process of the present disclosure, a magnetic field may be applied to the crucible comprising the silicon melt. Either cusp or horizontal magnet field can be applied to set the appropriate crystal/melt interface, i.e., the shape and height of the meniscus. The magnetic field is used to fix a desire crystal/melt interface shape and height primarily, and control of the oxygen content, Oi, is a subordinate purpose.

Control of the melt flow and the shape of the melt/solid interface and therefore the quality of the ingot may be enhanced by the application of a magnetic field to the silicon melt during growth of the main body of the single crystal silicon ingot. In some embodiments, the applied magnetic field maintains a substantially constant melt/solid interface profile during at least about 70% of the growth of the main body of the single crystal silicon ingot, or between about 70% and about 90% of the growth of the main body of the single crystal silicon ingot. The magnetic field applies electromagnetic force, which affects the silicon melt flow, so the heat transfer in the melt is affected. It changes the profile of crystal/melt interface and the temperature of growing crystal, which are the key control parameter of perfect silicon.

The magnetic field impacts the oxygen content and uniformity in the ingot. The source of oxygen is the ingot is from dissolution of the quartz crucible wall, evaporation SiOx (g) at the melt free surface (controlled by melt flow kinetics) and incorporation into growing crystal front. The magnet field impacts the convective melt flow during growth which can impact Oxygen evaporation and incorporation. The variation of oxygen incorporation into the single crystal silicon ingot by time increment is controlled by the diffusion and convection of oxygen in the melt according to the following equation:

$$\frac{\partial C}{\partial t} = \nabla C - v\rho + \text{SOURCE}.$$

C is the concentration of oxygen is the solidifying silicon, t is time, v is the convection velocity (melt flow velocity), rho, $\rho$, is the density of silicon melt, $\nabla$ is the gradient (d/dx). The applied magnetic field affects the melt velocity (v) and the gradient of oxygen concentration in the melt (dC/dx=$\nabla$C). Since magnetic field results in a steady state melt flow, the incorporating of oxygen, Oi, into the ingot is time constant, which enhances radial and axial oxygen concentration uniformity. The SOURCE term is derived from two parameters, the dissolution of quartz (SiO$_2$) crucible which is the generation of oxygen (Si(l)+SiO2(s)→SiOx(g)), and the evaporation which is the removal (disappearance) of oxygen (SiOx(g)) from melt. In a batch Cz process, this SOURCE term is not constant. Instead, it depends upon the crystal length since the melt mass decreases as the crystal is grown. When the ingot has grown a substantial portion of its body length, the remaining melt volume is low, so that that amount of silicon melt in contact with the crucible is decreased, which therefore leads to lower concentrations of oxygen incorporated from the crucible into the melt. Therefore, the oxygen incorporated into solidifying silicon crystal is decreased, if other terms (diffusion, convection, evaporation) are constant. The melt free surface (contact surface between melt and gas) area affects the evaporation rate of SiOx(g). A small melt mass in a batch Cz process has relatively smaller surface area due to shape of crucible as shown in FIG. 1C. Less evaporation of SiOx(g) means more oxygen incorporation into the solidifying silicon crystal. According to the method of the present disclosure, the melt mass is maintained as constant since polysilicon is added as the crystal ingot grows. Accordingly, all source terms (generation of Oxygen by SiO$_2$ crucible dissolution into melt, and evaporation of SiOx(g) gas through melt free surface) are constant. Therefore, the diffusion and convection terms affect the oxygen of solidifying silicon crystal. The applied magnetic field makes melt flow more stable (i.e., melt flow is constant like as time independent steady condition), so incorporating Oxygen is uniform and stable in the axial and radial directions during growth of the entire length of the ingot. In some embodiments, interstitial oxygen may be incorporated into the ingot in a concentration between about 4 PPMA and about 18 PPMA. In some embodiments, interstitial oxygen may be incorporated into the ingot in a concentration between about 10 PPMA and about 35 PPMA. In some embodiments, the ingot comprises oxygen in a concentration of no greater than about 15 PPMA, or no greater than about 10 PPMA. Interstitial oxygen may be measured according to SEMI MF 1188-1105. In some embodiments, the main body interstitial oxygen concentration that varies by no more than 20% above and no less than 20% below an average main body oxygen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot. In some embodiments, the main body interstitial oxygen concentration that varies by no more than 10% above and no less than 10% below an average main body oxygen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot. In some embodiments, the main body interstitial oxygen concentration that varies by no more than 5% above and no less than 5% below an average main body oxygen concentration over at least 40% of axial length of the main body of the single crystal silicon ingot, at least 50% of axial length of the main body of the single crystal silicon ingot, at least 60% of axial length of the main body of the single crystal silicon ingot, at least 70% of axial length of the main body of the single crystal silicon ingot, or at least 80% of axial length of the main body of the single crystal silicon ingot, or at least 90% of axial length of the main body of the single crystal silicon ingot.

Figure 8A:
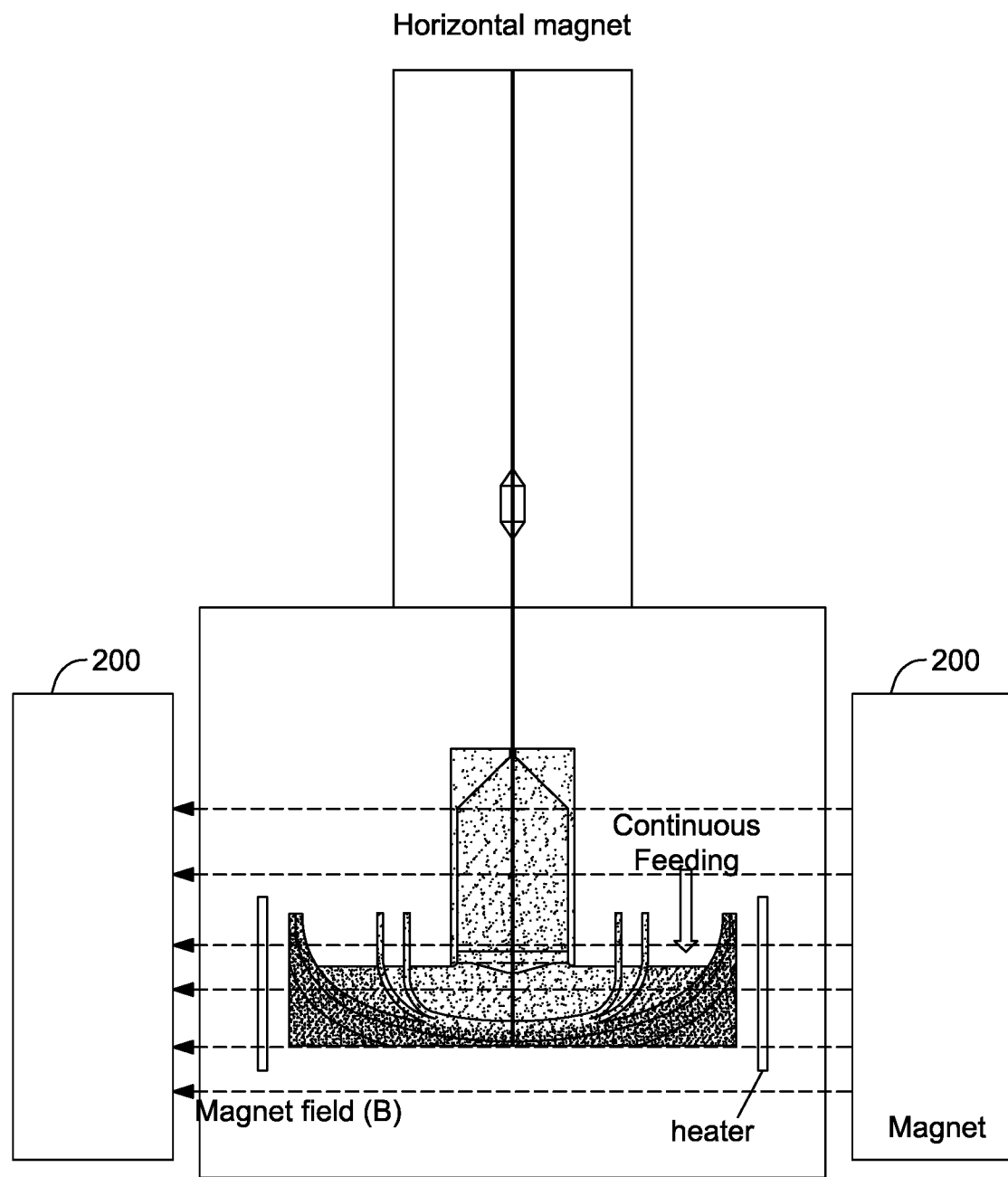
FIGS. 8A and 8B illustrate magnetic fields applied to the silicon melt during growth of an ingot by an exemplary continuous Cz process according to the method of the present disclosure.

In some embodiments, a horizontal magnetic field is applied to the silicon melt during growth of the main body of the single crystal silicon ingot. Such a horizontal field is illustrated in FIG. 8A, which is a depiction of a horizontal magnetic field superimposed over the crucible and growing ingot as depicted in FIG. 5. Crystal growth in presence of a horizontal magnetic field is achieved by placing the crucible holding the silicon melt between the poles of a conventional electromagnet 200. In some embodiments, the horizontal magnetic field may have a magnetic flux density between about 0.2 Tesla and about 0.4 Tesla in the melt area. Magnetic field variation in the melt is less than +/−about 0.03 Tesla in a given strength. Application of a horizontal magnetic field gives rise to Lorentz force along axial direction, in a direction opposite of fluid motion, opposing forces driving melt convection. The convection in the melt is thus suppressed, and the axial temperature gradient in the crystal near the interface increases. The melt-crystal interface then moves upward to the crystal side to accommodate the increased axial temperature gradient in the crystal near the interface and the contribution from the melt convection in the crucible decreases.

Figure 8B:
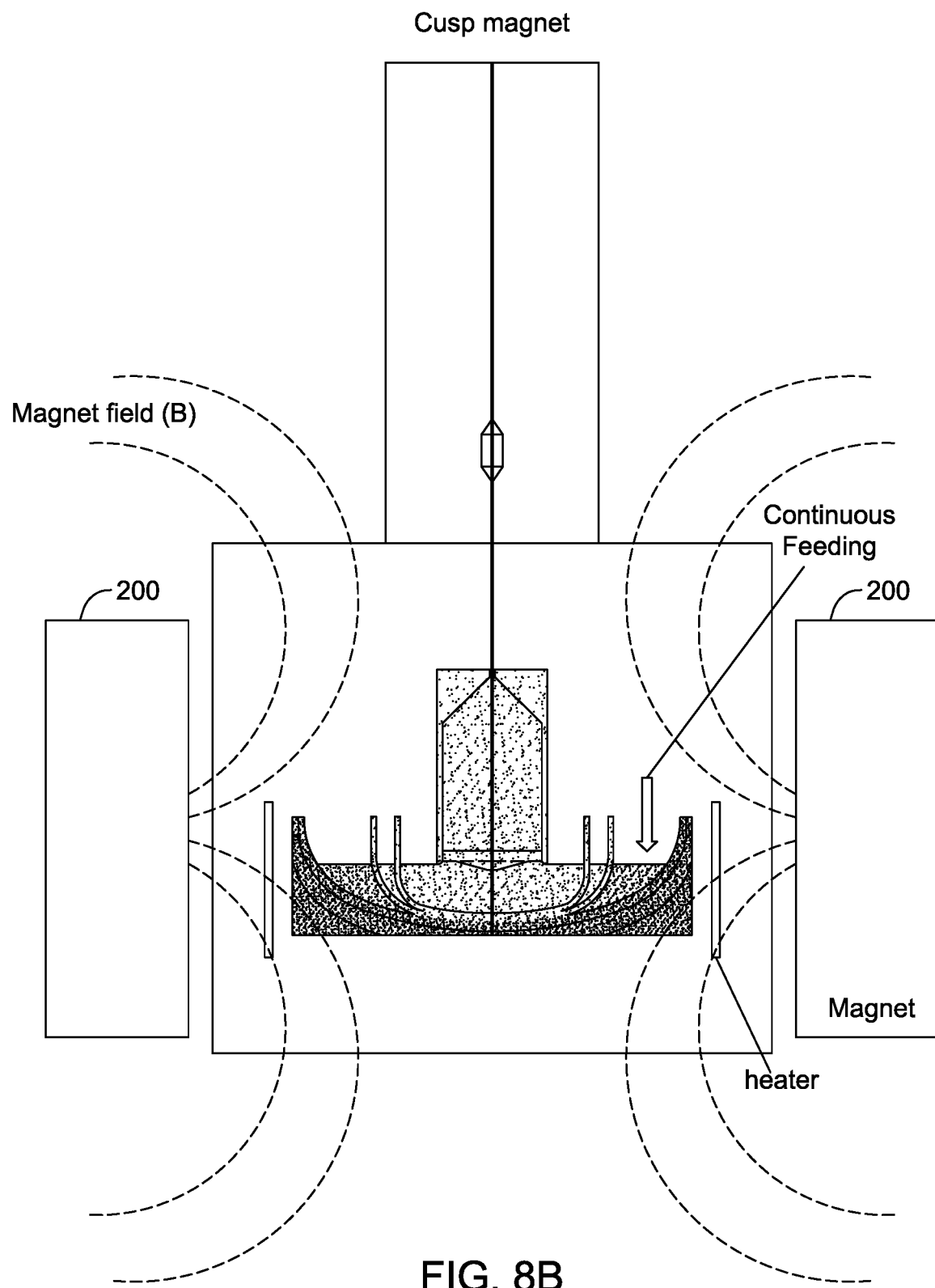

In some embodiments, a cusp magnetic field is applied to the silicon melt during growth of the main body of the single crystal silicon ingot. A cusp field is illustrated in FIG. 8B, which is a depiction of a cusp magnetic field superimposed over the crucible and growing ingot as depicted in FIG. 5. A cusp magnetic field has two controlling parameters, namely the magnetic flux density and magnetic field shape. A cusp magnetic field applies a horizontal (radial) magnetic field component at the nearest surface of the melt combined with a vertical (axial) magnetic field deeper in the melt near the axis of the ingot. The cusp magnetic field is generated using a pair of Helmholtz coil carrying current in opposite direction. As a result, at the position halfway between the two magnetic fields, vertically along the ingot axis, the magnetic fields cancel each other out to make a vertical magnetic field component at or near zero. For example, the cusp magnetic flux density is typically about zero to about 0.2 Tesla in the axial direction. The magnetic flux density in the radial direction is generally higher than the magnetic flux density in the vertical direction. For example, the cusp magnetic flux density is typically between about 0 and about 0.6 T in the radial position, such as between about 0.2 and about 0.5 T, dependent upon the radial position. The radial cusp magnetic field restrains the flow of the melt, to thereby stabilize the melt. In other words, application of a radial cusp magnetic field induces convection at a portion adjacent to the solid-liquid interface at which crystal growth occurs, and suppresses convection at the remaining portions of the melt, to thereby serve as an effective method for realizing uniform oxygen distribution. Thermal melt convection can be locally and independently controlled by the cusp magnetic field at the melt free surface and at the melt crucible interface at the same time. This enables to control the oxygen concentration in the growing crystal by magnetic flux density only, irrespective of crystal rotation speed. In presence of an axial or a radial magnetic field, control of oxygen concentration is achieved via control of crystal rotation speed. Application of the cusp magnetic field may enable growth on an ingot comprising less oxygen content than an ingot grown without an applied magnetic field, such as no greater than about 15 PPMA, or no greater than about 10 PPMA. Interstitial oxygen may be measured according to SEMI MF 1188-1105.

The method of the present disclosure enables growth of single crystal silicon ingots by the continuous Czochralski method meeting or exceeding industry specifications for perfect silicon. Factors contributing to the growth of perfect silicon crystals include determining the critical pull speed for growing perfect silicon, maintaining a constant pull speed at the critical speed over a substantial portion of the growth of the main body of the single crystal silicon ingot, and applying a magnetic field to maintain the shape and height of the melt/solid interface. Once the configurations of pull speed and magnetic field are determined, the pull speed may be maintained at a constant rate due to the continuous addition of polycrystalline silicon to maintain a constant melt volume and melt elevation level. Accordingly, unlike conventional methods of growing ingots, the pull speed is constant over a substantial portion of the growth of the ingot. In view of the process controls enabled by the method disclosed herein, the method of the present disclosure enables the growth of a single crystal silicon ingot comprising perfect silicon over at least about 70% of the length of the main body of the single crystal silicon ingot, such as over at least about 80% of the length of the main body of the single crystal silicon ingot, or even over at least about 90% of the length of the main body of the single crystal silicon ingot.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

We claim:

1. A method of preparing a single crystal silicon ingot by the Continuous Czochralski method, the method comprising:

adding an initial charge of polycrystalline silicon to a crucible, the initial charge further comprising a source of nitrogen;

heating the crucible comprising the initial charge of polycrystalline silicon and the source of nitrogen to cause a silicon melt to form in the crucible, the silicon melt comprising an initial volume of molten silicon and having an initial melt elevation level;

contacting a silicon seed crystal with a silicon melt;

withdrawing the silicon seed crystal to grow a neck portion, wherein the silicon seed crystal is withdrawn at a neck portion pull rate during growth of the neck portion, and further wherein the neck portion has a neck portion nitrogen concentration of at least about $1 \times 10^{13}$ atoms/cm$^3$, wherein the neck portion nitrogen concentration varies by no more than 20% above and no less than 20% below an average neck portion nitrogen concentration;

withdrawing the silicon seed crystal to grow an outwardly flaring seed-cone adjacent the neck portion, wherein the silicon seed crystal is withdrawn at a seed-cone pull rate during growth of the outwardly flaring seed-cone, and further wherein the outwardly flaring seed-cone has an outwardly flaring seed-cone nitrogen concentration of at least about $1 \times 10^{13}$ atoms/cm$^3$, wherein the outwardly flaring seed-cone nitrogen concentration varies by no more than 20% above and no less than 20% below an average outwardly flaring seed-cone nitrogen concentration; and withdrawing the silicon seed crystal to grow a main body of the single crystal silicon ingot adjacent the outwardly flaring seed-cone, wherein the silicon melt comprises a volume of molten silicon and a melt elevation level during growth of the main body of the single crystal silicon ingot, and further wherein the main body of the single crystal silicon has a main body nitrogen concentration of at least about $1 \times 10^{13}$ atoms/cm$^3$, wherein the main body of the single crystal silicon ingot is at least about 1000 millimeters long, and further wherein the main body nitrogen concentration varies by no more than 20% above and no less than 20% below an average main body nitrogen concentration over at least 40% of axial length of the main body of the single crystal silicon ingot;

wherein the main body of the single crystal silicon ingot is grown at an initial variable main body pull rate and a constant main body pull rate, wherein the main body of the single crystal silicon ingot is grown at the initial variable main body pull rate for less than about 20% of a length of the main body of the single crystal silicon ingot and grown at the constant main body pull rate during growth for at least about 30% of the length of the main body of the single crystal silicon ingot, wherein the constant main body pull rate is between about 0.4 mm/min and about 0.8 mm/min, and further wherein the main body of the single crystal silicon ingot has a diameter of at least about 150 millimeters; and further wherein polycrystalline is continuously fed or periodically feed to the crucible to thereby replenish a volume of molten silicon and to thereby maintain a melt elevation level in the crucible during growth of the main body of the single crystal silicon ingot and the source of nitrogen is continuously fed or periodically fed to the crucible to thereby replenish an amount of nitrogen.

2. The method of claim 1 wherein the source of nitrogen is a solid source of nitrogen.

3. The method of claim 1 wherein the source of nitrogen is silicon nitride powder.

4. The method of claim 1 wherein the source of nitrogen is a silicon wafer having a silicon nitride film on a surface thereof, wherein the silicon wafer is optionally crushed.

5. The method of claim 1 wherein the source of nitrogen is silicon oxynitride glass.

6. The method of claim 1 wherein the source of nitrogen is nitrogen gas.

7. The method of claim 1 wherein the neck portion nitrogen concentration is between about $1 \times 10^{13}$ atoms/cm$^3$ and about $1 \times 10^{15}$ atoms/cm$^3$.

8. The method of claim 1 wherein the outwardly flaring seed-cone nitrogen concentration is between about $1 \times 10^{13}$ atoms/cm$^3$ and about $1 \times 10^{15}$ atoms/cm$^3$.

9. The method of claim 1 wherein the source of nitrogen is continuously fed or periodically fed to the crucible in an amount between about 1 milligram nitrogen and about 100 milligrams nitrogen per 50 mm of axial length of the main body of the single crystal silicon ingot.

10. The method of claim 1 wherein silicon nitride is continuously fed or periodically fed to the crucible during growth of the main body of the single crystal silicon ingot in an amount between about 2.5 milligrams silicon nitride and 250 milligrams silicon nitride per 50 mm of axial length of the main body of the single crystal silicon ingot.

11. The method of claim 1 wherein the main body nitrogen concentration is between about $1 \times 10^{13}$ atoms/cm$^3$ and about $1 \times 10^{15}$ atoms/cm$^3$.

12. The method of claim 1 wherein the main body nitrogen concentration is between about $5 \times 10^{13}$ atoms/cm$^3$ and about $1 \times 10^{14}$ atoms/cm$^3$, over at least 40% of axial length of the main body of the single crystal silicon ingot.

13. The method of claim 1 wherein the main body nitrogen concentration is between about $1 \times 10^{13}$ atoms/cm$^3$ and about $1.5 \times 10^{14}$ atoms/cm$^3$, and further wherein the main body nitrogen concentration varies by no more than 20% above and no less than 20% below an average main body nitrogen concentration over at least 40% of axial length of the main body of the single crystal silicon ingot.

14. The method of claim 1 wherein the main body nitrogen concentration is between about $5 \times 10^{13}$ atoms/cm$^3$ and about $1 \times 10^{14}$ atoms/cm$^3$ and further wherein the main body nitrogen concentration varies by no more than 20% above and no less than 20% below an average main body nitrogen concentration over at least 40% of axial length of the main body of the single crystal silicon ingot.

15. The method of claim 1 wherein a magnetic field is applied to the silicon melt during growth of the main body of the single crystal silicon ingot, and further wherein the main body of the single crystal silicon ingot comprises a main body interstitial oxygen concentration between about 10 PPMA and about 35 PPMA, and further wherein the main body interstitial oxygen concentration varies by no more than 20% above and no less than 20% below an average main body oxygen concentration.

16. The method of claim 15 wherein a horizontal magnetic field is applied to the silicon melt during growth of the main body of the single crystal silicon ingot.

17. The method of claim 15 wherein a cusp magnetic field is applied to the silicon melt during growth of the main body of the single crystal silicon ingot.

18. The method of claim 15 wherein the applied magnetic field maintains a substantially constant melt/solid interface profile during at least about 70% of the growth of the main body of the single crystal silicon ingot.

19. The method of claim 15 wherein the applied magnetic field maintains a substantially constant melt/solid interface profile during between about 70% and about 90% of the growth of the main body of the single crystal silicon ingot.

20. The method of claim 1 wherein the main body of the single crystal silicon ingot is at least 1400 millimeters long.

21. The method of claim 1 wherein the main body of the single crystal silicon ingot has a diameter of at least about 200 millimeters.

22. The method of claim 1 wherein the constant main body pull rate is between about 0.4 mm/min and about 0.7 mm/min.

23. The method of claim 1 wherein the main body of the single crystal silicon ingot is grown at the initial variable main body pull rate for between about 5% and about 20% of the length of the main body of the single crystal silicon ingot.

24. The method of claim 1 wherein the main body of the single crystal silicon ingot is grown at the constant main body pull rate during growth for at least about 50% of the length of the main body of the single crystal silicon ingot.

25. The method of claim 1 wherein the main body of the single crystal silicon ingot is grown at the constant main body pull rate during growth for at least about 70% of the length of the main body of the single crystal silicon ingot.

26. The method of claim 1 wherein the main body of the single crystal silicon ingot is grown at the constant main body pull rate during growth for at least about 80% of the length of the main body of the single crystal silicon ingot.

27. The method of claim 1 wherein the main body of the single crystal silicon ingot is grown at the constant main body pull rate during growth for at least about 90% of the length of the main body of the single crystal silicon ingot.

28. The method of claim 1 wherein the main body pull rate is a constant critical pull rate sufficient to avoid agglomerated point defects over at least 70% of the length of the main body of the single crystal silicon ingot.

29. The method of claim 1 wherein the main body pull rate is a constant critical pull rate sufficient to avoid agglomerated point defects over at least 90% of the length of the main body of the single crystal silicon ingot.

30. The method of claim 1 wherein the volume of molten silicon varies by no more than about 1.0 volume % during growth of at least about 90% the main body of the single crystal silicon ingot.

31. The method of claim 1 wherein the volume of molten silicon varies by no more than about 0.5 volume % during growth of at least about 90% the main body of the single crystal silicon ingot.

32. The method of claim 1 wherein the volume of molten silicon varies by no more than about 0.1 volume % during growth of at least about 90% the main body of the single crystal silicon ingot.

33. The method of claim 1 wherein the melt elevation level varies by less than about +/−0.5 millimeter during growth of at least about 90% the main body of the single crystal silicon ingot.

34. The method of claim 1 wherein the main body of the single crystal silicon ingot comprises perfect silicon over at least about 70% of the length of the main body of the single crystal silicon ingot.

35. The method of claim 1 wherein the main body of the single crystal silicon ingot comprises perfect silicon over at least about 80% of the length of the main body of the single crystal silicon ingot.

36. The method of claim 1 wherein the main body of the single crystal silicon ingot comprises perfect silicon over at least about 90% of the length of the main body of the single crystal silicon ingot.

* * * * *